US007237340B2

(12) United States Patent
Johnson et al.

(10) Patent No.: US 7,237,340 B2
(45) Date of Patent: Jul. 3, 2007

(54) MULTI-TASKING UTILITY TOOL

(75) Inventors: Ronald L. Johnson, San Jose, CA (US); Idriss Mansouri-Chafik, Santa Clara, CA (US); Skye David Barcus, Ben Lomond, CA (US)

(73) Assignee: Wagic, Inc., Los Gatos, CA (US)

( * ) Notice: Subject to any disclaimer, the term of this patent is extended or adjusted under 35 U.S.C. 154(b) by 39 days.

(21) Appl. No.: 10/997,386

(22) Filed: Nov. 24, 2004

(65) Prior Publication Data

US 2005/0150116 A1 Jul. 14, 2005

Related U.S. Application Data

(63) Continuation-in-part of application No. 10/881,776, filed on Jun. 29, 2004, which is a continuation of application No. 10/218,388, filed on Aug. 12, 2002, now Pat. No. 6,874,188, which is a continuation-in-part of application No. 10/184,303, filed on Jun. 26, 2002.

(60) Provisional application No. 60/312,131, filed on Aug. 13, 2001.

(51) Int. Cl.

| | |
|---|---|
| ***G06K 7/10*** | (2006.01) |
| ***H04B 1/06*** | (2006.01) |
| ***H05K 11/00*** | (2006.01) |
| ***B26B 11/00*** | (2006.01) |
| ***B25F 1/00*** | (2006.01) |
| ***B25B 1/08*** | (2006.01) |

(52) U.S. Cl. ............................ 30/162; 30/123; 30/125; 7/160; 7/170; 235/462.49; 235/462.03; 235/462.47; 455/344; 455/349

(58) Field of Classification Search .................... 7/160, 7/163, 158, 167, 169, 170; 362/119; 30/162, 30/123, 125, 335, 336; 235/462.47, 462.49, 235/472.03; 455/344, 349
See application file for complete search history.

(56) References Cited

U.S. PATENT DOCUMENTS

| | | | | | |
|---|---|---|---|---|---|
| 1,368,944 | A | | 2/1921 | Kurose | |
| 1,444,155 | A | | 2/1923 | Jorgensen | |
| 2,980,996 | A | | 4/1961 | R.F. Beran | |
| 3,657,812 | A | | 4/1972 | Lee | 30/162 |
| 3,660,895 | A | | 5/1972 | West | 30/162 |
| 4,068,375 | A | | 1/1978 | Rathbun et al. | 30/125 |
| 4,602,397 | A | | 7/1986 | Chao | 7/163 |
| 4,635,309 | A | | 1/1987 | Larsen | 7/158 |
| 4,744,146 | A | | 5/1988 | Schmidt | 30/162 |
| 4,792,883 | A | * | 12/1988 | Ackerman et al. | 362/102 |
| 4,805,304 | A | | 2/1989 | Knoop | 30/162 |
| 4,854,045 | A | * | 8/1989 | Schaub | 30/155 |
| 4,890,387 | A | | 1/1990 | Canino | 7/118 |
| 4,891,881 | A | | 1/1990 | Mills | 30/123 |

(Continued)

FOREIGN PATENT DOCUMENTS

DE 196 23 167 A1 11/1996

*Primary Examiner*—D. S. Meislin
(74) *Attorney, Agent, or Firm*—Haverstoock & Owens LLP

(57) ABSTRACT

A utility tool comprising a body having a first end and a second end positioned on opposite ends of the body; a removable device; as well as a first tool and a second tool configured to be selectively coupled to each other or one of either the first end and second end of the body.

15 Claims, 16 Drawing Sheets

U.S. PATENT DOCUMENTS

| | | | | | |
|---|---|---|---|---|---|
| 5,025,520 | A | | 6/1991 | Watkins | 7/163 |
| 5,059,126 | A | * | 10/1991 | Kimball | 434/308 |
| 5,174,028 | A | | 12/1992 | Seltzer, Jr. | 30/337 |
| 5,315,760 | A | | 5/1994 | Emerson | 30/123 |
| 5,402,575 | A | | 4/1995 | Maxcy | 30/123 |
| 5,450,775 | A | | 9/1995 | Kozak | 81/440 |
| 5,557,818 | A | | 9/1996 | Leon | 7/160 |
| 5,711,194 | A | | 1/1998 | Anderson et al. | 81/440 |
| 5,809,600 | A | | 9/1998 | Cachot | 7/128 |
| 5,813,121 | A | | 9/1998 | Gringer | 30/162 |
| 5,887,306 | A | | 3/1999 | Huang | 7/165 |
| 5,939,702 | A | * | 8/1999 | Knighton et al. | 235/472.03 |
| 5,945,656 | A | * | 8/1999 | Lemelson et al. | 235/462.01 |
| 5,955,719 | A | * | 9/1999 | Southworth et al. | 235/454 |
| 5,957,601 | A | | 9/1999 | Weiss | 401/18 |
| 6,050,490 | A | * | 4/2000 | Leichner et al. | 235/462.49 |
| 6,104,603 | A | * | 8/2000 | Wang | 361/679 |
| 6,119,944 | A | * | 9/2000 | Mulla et al. | 235/472.03 |
| 6,273,582 | B1 | * | 8/2001 | Taggart et al. | 362/119 |
| 6,276,014 | B1 | | 8/2001 | Lee | 7/158 |
| 6,363,614 | B1 | | 4/2002 | Umstead et al. | 30/144 |
| 6,446,871 | B1 | * | 9/2002 | Buckley et al. | 235/472.03 |
| 6,454,427 | B1 | * | 9/2002 | Chen | 362/119 |
| 6,467,114 | B1 | | 10/2002 | Sigl | 7/144 |
| 6,481,628 | B2 | * | 11/2002 | Liou et al. | 235/472.03 |
| 6,641,044 | B2 | * | 11/2003 | Plesko | 235/462.49 |
| 6,752,317 | B2 | * | 6/2004 | Dymetman et al. | 235/462.45 |
| 6,868,571 | B1 | * | 3/2005 | Fischer et al. | 7/164 |
| 2003/0106159 | A1 | * | 6/2003 | Ackeret et al. | 7/160 |
| 2004/0016058 | A1 | * | 1/2004 | Gardiner et al. | 7/119 |
| 2004/0141313 | A1 | * | 7/2004 | Elsener | 362/119 |
| 2005/0081302 | A1 | * | 4/2005 | Elsener | 7/118 |
| 2006/0030289 | A1 | * | 2/2006 | Liguori et al. | 455/344 |

* cited by examiner

MULTI-TASKING UTILITY TOOL

RELATED APPLICATIONS

This Patent Application is a continuation-in-part of U.S. patent application Ser. No. 10/881,776, filed on Jun. 29, 2004, and entitled "MULTI-TASKING UTILITY TOOL" which is a continuation of U.S. patent application Ser. No. 10/218,388, filed on Aug. 12, 2002 now U.S. Pat. No. 6,874,188 and entitled "MULTI-TASKING UTILITY TOOL" which is a continuation in part of U.S. patent application Ser. No. 10/184,303 filed on Jun. 26, 2002, and entitled "MULTI-TASKING UTILITY TOOL" which claims priority under 35 U.S.C. §119(e) of U.S. Provisional Patent Application Ser. No. 60/312,131, filed on Aug. 13, 2001, and entitled "THREE-IN-ONE UTILITY TOOL". The U.S. patent application Ser. No. 10/881,776, filed on Jun. 29, 2004, and entitled "MULTI-TASKING UTILITY TOOL", the U.S. patent application Ser. No. 10/218,388 filed on Aug. 12, 2002, and entitled "MULTI-TASKING UTILITY TOOL", the U.S. patent application Ser. No. 10/184,303, filed on Jun. 26, 2002 and entitled "THREE-IN-ONE UTILITY TOOL" and the U.S. Provisional Patent Application Ser. No. 60/312,131 filed on Aug. 13, 2001, and entitled "THREE-IN-ONE UTILITY TOOL" are all also hereby incorporated by reference.

FIELD OF THE INVENTION

The present invention relates to the field of hand held tools. More specifically, the present invention relates to the field of a multi-tasking tool having an internal device and replaceable capsuled instruments, some instruments capable of interfacing with the internal device.

BACKGROUND OF THE INVENTION

In the existing world of tools many different types of cutting tools are available. One of these cutting tools is a box cutting tool or an Exacto knife. The knife portion in the box cutting knife is sufficiently sharp such that the knife will easily cut through material. Therefore, many carpenters and tool users mark where the material is to be cut before using the Exacto knife to cut the material. Also, when using such a knife to open boxes, a writing instrument is useful to input markings on the box regarding the contents of the box. Thus, the user must keep a pen or marker nearby when using a box cutting knife. Although box cutting knives are very popular, the knife blade is very sharp and therefore dangerous. Box cutting knives have a knife switch on the top of the body which slides between an extended and a retracted position. When the knife switch is in the retracted position, the knife itself is contained within the body of the tool. However, when the user wants to use the knife, he or she pushes the knife switch forward to the extended position, whereby the knife extends out a front slot. Box cutting knives do not have a safety mechanism which automatically causes the knife to retract within the body of the cutting tool when not in use. Thus, a user may easily cut herself if not paying attention to the knife blade.

Modern employers value efficiency in all sectors of their businesses. One area where larger and more-organized companies have found they are able to improve over their competitors is supply chain management. Much of supply chain optimization involves complicated modeling and efficient, intuitive management software. However, some simple improvements in the efficiency of tasks frequently performed by supply chain workers can also be valuable.

As modern corporations become more and more reliant on geographically diverse suppliers and customers, shipping and receiving efficiency becomes more important. Frequent tasks performed by shipping and receiving employees include unpacking boxes, marking boxes, and checking items into and out of inventory. Traditionally these tasks require a diverse array of tools. Unpacking requires a cutting tool, marking requires a marking tool and inventory maintenance is performed either by hand, with the aid of a marking tool, or by some variety of scanner. The need to switch between tools to perform these tasks leads to inefficiency. Because shipping and receiving involves a variety of tasks that are traditionally performed with the aid of individually specific tools, a need for a single tool capable of easily performing all necessary tasks would constitute an improvement.

Furthermore, many users prefer to accompany manual labor, such as scanning and marking, with audio entertainment, such as is available from a common transistor radio with an external speaker. Naturally, because such labor is often across an area large enough that a non-portable radio is ineffective, many users of such tools prefer to carry a portable radio along with them while working. This is inconvenient and leads to inefficiency.

SUMMARY OF THE INVENTION

In one aspect of the invention, a utility tool comprises a body having a first end and a second end. The first end and the second end are positioned on opposite ends of the body. A cutting tool is positioned within the body, wherein the cutting tool is configured to extend out from the first end. A cartridge unit is coupled to the body, wherein the cartridge unit includes a first tool. The cartridge unit is moveable between a first position and a second position, wherein the first tool extends out from the second end when the housing member is in the first position. The utility tool further includes a knife switch that is coupled to the cutting tool, wherein the knife switch allows the cutting tool to slidably extend out and retract within the utility tool. The cartridge unit further comprises a second tool extending on an end of the cartridge unit opposite of the first instrument. The second tool extends out from the second end when the housing member is in the extended position. The first tool is a writing instrument and the second tool is a marking instrument. The utility tool further comprises a container that is integrally formed within the utility tool for housing one of the ends of the cartridge unit positioned within the utility tool. The utility tool includes a track that is positioned along the utility tool, wherein the cartridge unit is coupled to the track and moveable along the track.

In another aspect of the invention, a utility tool comprises a body and a first housing coupled to the body. The first housing contains a cutting tool, whereby the cutting tool is configured to extend out from the first housing. A second housing is coupled to the body, in which the second housing has a first end and a second end. The first end and the second end are positioned opposite from one another. The second housing is configured to rotate between a first position and a second position. The first end is positioned within the body in the first position. The first end is positioned away from the body in the second position. The utility tool further comprises a knife switch that is coupled to the cutting tool. The knife switch retracts the cutting tool within the utility tool.

The cartridge unit further comprises a first tool extending from the first end and a second tool extending from the second end. The first tool is preferably a writing instrument and the second tool is preferably a highlighting marker. The utility tool further comprises a container integrally formed within the utility tool, whereby the container is for housing one of the ends of the second housing positioned within the utility tool. The utility tool has a track integrally formed within and positioned along the utility tool, wherein the second housing is coupled to the track and moveable along the track.

In another aspect, a cutting tool has a first end and a second end positioned opposite from one another. The cutting tool comprises a cartridge unit that is positionable within the cutting tool. The cartridge unit has a third end and a fourth end, wherein the third end and the fourth end are configured opposite from one another. The cartridge unit is rotatable about an axis, wherein the third end is positioned within the cutting tool when the fourth end is proximal to the first end. The fourth end is positioned within the cutting tool when the third end is proximal to the first end. The cutting tool further comprises a knife configured to extend out from the second end of the cutting tool. The cutting tool further comprises a knife switch that is coupled to the knife, wherein the knife switch retracts the knife within the cutting tool. The cartridge unit further comprises a first writing instrument which extends from the third end and a second writing instrument which extends from the fourth end. The first writing instrument is preferably a pen, and the second writing instrument is preferably a marker. The cutting tool further comprises a container integrally formed within the cutting tool, whereby the container is for housing the end of the cartridge unit positioned within the cutting tool. The cutting tool has a track integrally formed within and positioned along the cutting tool, wherein the cartridge unit is coupled to the track and moveable along the track.

Yet in another aspect, a multi-tasking utility tool comprises a body as well as a knife compartment that is coupled to the body. The knife compartment contains a cutting tool. The cutting tool is configured to extend out from the knife compartment. A cartridge unit is coupled to the body. The cartridge unit has a first writing instrument and a second writing instrument. The first writing instrument and the second writing instrument are positioned opposite from one another. The cartridge unit is rotatable between a first position and a second position. The first writing instrument is positioned within the body in the first position and extends away from the body in the second position. The utility tool further comprises a knife switch which is coupled to the cutting tool, wherein the knife switch retracts the cutting tool within the knife compartment. The first writing instrument is a pen and the second writing instrument is a highlighting marker. The utility tool further comprises a container that is integrally formed within the body. The container is for housing one of the ends of the cartridge unit when positioned within the body. The utility tool having a track integrally formed within and positioned along the utility tool, wherein the cartridge unit is coupled to the track and moveable along the track.

In yet another aspect, a utility tool which comprises a body having a first end and a second end. The first end and the second end are positioned on opposite ends of the body. The utility tool includes a removable blade cartridge that is positioned within the body. A knife blade that is within the removable blade cartridge is configured to slidably extend out from the first end. The utility tool includes a first tool that is configured to be selectively coupled to one of either the first end and second end of the body. The removable blade cartridge further comprises a knife switch that is coupled to the knife blade. The knife switch allows the knife blade to slidably move between an extended position and a retracted position. The knife switch is able to move the knife blade from the retracted position to the extended position only when the blade cartridge is engaged within the body. The utility tool further comprises a spring mechanism that is coupled to the knife switch. The spring mechanism biases the knife blade to the retracted position. The utility tool further comprises a second tool that is configured to be selectively coupled to the first tool. The second tool is configured to be selectively coupled to one of either the first end and the second end of the body. The first tool and the second tool are preferably writing instruments. Alternatively, the second tool is a measuring instrument such as a retractable tape measure, level, compass, or bar code scanner. The second tool is alternatively an illuminating instrument. The body includes a blade cartridge bay which receives the removable blade cartridge. The blade cartridge includes a leaf member which engages and disengages the blade cartridge from the blade cartridge bay by a snap fit. The blade cartridge further comprises a first blade member; and a second blade member which is in communication and positioned substantially parallel to the first blade member. The blade cartridge includes a recess slot which is located between the first blade member and the second blade member. The recess is for housing the knife blade. The blade cartridge includes a thin film of material that is configured over a knife slot which is in communication with the recess slot. The knife blade pierces the thin film when moving initially from the retracted position to the extended position. The utility tool further comprises a clip that is coupled to the body.

In yet another aspect, a utility tool comprises a body that has a substantially cylindrical shape. The body includes a first end and a second end which are positioned oppositely from one another. The body includes a blade cartridge bay within. The utility tool includes a removable blade cartridge that is coupled to the blade cartridge bay. The blade cartridge contains a knife blade that is configured to slidably extend out the first end. The utility tool includes a first tool that is configured to be selectively coupled to one of either the first end and the second end. The blade cartridge includes a knife switch that is coupled to the removable knife blade, whereby the knife switch automatically retracts the knife blade within the body when not in use. The utility tool further comprises a second tool that is configured to be coupled to the first tool or one of either the first end and the second end. The first tool and second tool are preferably a writing instrument. Alternatively, the second tool is a measuring device, such as a retractable tape measure, level, compass or bar code scanner. Alternatively, the second tool is an illuminating device. Alternatively, the second tool is an electronic device capable of audio output, such as an compressed digital audio player, FM radio, or FRPS radio coupled to a speaker.

In yet another aspect, a removable blade cartridge that is configured to fit within a corresponding blade cartridge bay. The blade cartridge comprises a blade cartridge body that has a recess slot within and a knife blade slot that is in communication with the recess slot. The cartridge includes a knife blade that is positionable within the recess and is configured to slidably move between an open position and a closed position. The cartridge includes a guide assembly that is coupled with the knife blade, wherein the guide assembly drives the knife blade between the closed position and the open position. The cartridge includes a leaf member for engaging and disengaging the blade cartridge to the blade cartridge bay. The blade cartridge body further comprises a first blade member and a second blade member. The second blade member is in communication and is positioned substantially parallel to the first blade member. The recess slot is located between the first blade member and the second blade member. The blade cartridge body includes a thin film of material that is configured over the knife slot such that the knife blade pierces the thin film when moving initially from the closed position to the open position. The bay cartridge bay further comprises a guide spring, wherein the guide spring urges the knife blade to retract to the closed position. The knife blade moves between the closed position to the open position only when the blade cartridge is engaged within the blade cartridge bay. The cartridge further comprises a safety spring for applying a first force to the guide assembly when the blade cartridge is disengaged from the blade cartridge bay. The knife blade is prevented from moving when the first force is applied to the guide assembly. The guide spring applies a second force to the guide assembly, wherein the knife blade is allowed to move between the closed position and the open position when the second force is applied. The guide assembly further comprises a knife switch coupled to the knife blade.

In yet another aspect, a removable blade cartridge comprises means for housing a knife blade. The knife blade is prevented from moving between a first position and a second position, The cartridge includes a means for driving the knife blade between the first and second position. The knife blade is capable of moving when the driving means is activated. The cartridge includes a means for activating the driving means, wherein said driving means is activated when said activating means applies a force to said driving means.

In yet another aspect of the invention, a utility tool comprises a body and a first housing coupled to the body. The first housing contains an electronic memory module, whereby the electronic memory module is coupled to an electronic interface configured to send input and output of from the first housing. An electronic device is couplable to the first housing. This device is preferably an audio output device optionally coupled to the memory module, but could be another electronic device. The output device is preferably a compressed audio decoder, but could be an AM/FM or FRPS radio. A second housing is coupled to the body, in which the second housing has a first end and a second end. The first end and the second end are positioned opposite from one another. The second housing is configured to rotate between a first position and a second position. The first end is positioned within the body in the first position. The first end is positioned away from the body in the second position. The cartridge unit further comprises a first tool extending from the first end and a second tool extending from the second end. The first tool is preferably a writing instrument and the second tool is preferably an electronic instrument. The electronic instrument is preferably a bar code reader and is preferably coupled to the memory module. The electronic instrument is alternatively a label printer. The utility tool further comprises a container integrally formed within the utility tool, whereby the container is for housing one of the ends of the second housing positioned within the utility tool. The utility tool has a track integrally formed within and positioned along the utility tool, wherein the second housing is coupled to the track and moveable along the track.

In the preferred embodiment, a utility tool comprises a body that has a substantially cylindrical shape. The body includes a first end and a second end which are positioned oppositely from one another. The body includes an electronic memory module bay within. The utility tool includes a removable memory module that is coupled to the memory module bay. The utility tool includes a first tool that is configured to be selectively coupled to one of either the first end and the second end. The utility tool further comprises a second tool that is configured to be coupled to the first tool or one of either the first end and the second end. The first tool is preferably a writing instrument. The second tool is preferably an electronic device capable of audio output, such as an compressed digital audio player, FM radio, or FRPS radio coupled to a speaker and further coupleable to the memory module. Alternatively, the second tool is a measuring device, such as a retractable tape measure, level, compass or bar code scanner coupled to the memory module. Alternatively, the second tool is an illuminating device.

Other features and advantages of the present invention will become apparent after reviewing the detailed description of the preferred embodiments set forth below.

DETAILED DESCRIPTION OF THE PREFERRED EMBODIMENT

Reference will now be made in detail to the preferred and alternative embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which is included within the spirit and scope of the invention as defined by the appended claims. Furthermore, in the following detailed description of the present invention, numerous specific details are set forth in order to provide a thorough understanding of the present invention. However, it should be noted that the present invention is able to be practiced without these specific details. In other instances, well known methods, procedures and components have not been described in detail as not to unnecessarily obscure aspects of the present invention.

Figure 1:
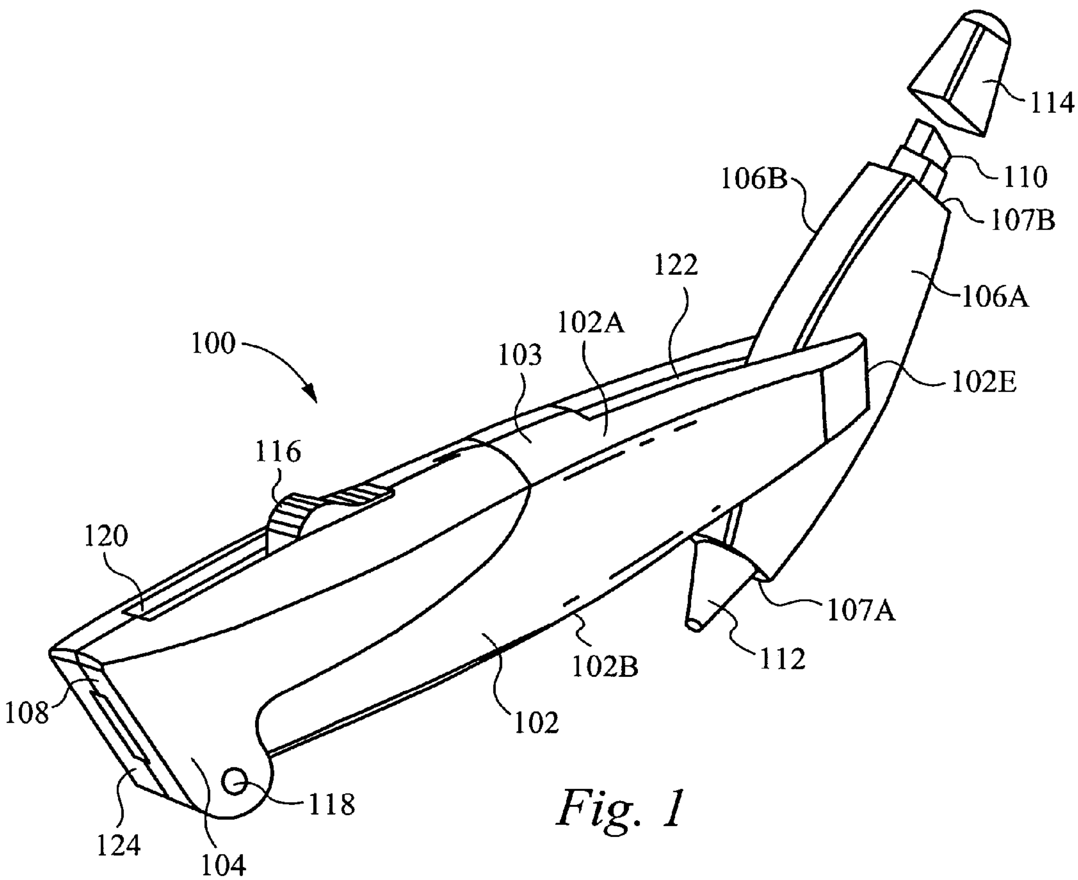
FIG. 1 illustrates a perspective view of an alternate embodiment of the utility tool in accordance with the present invention.
Figure 2:
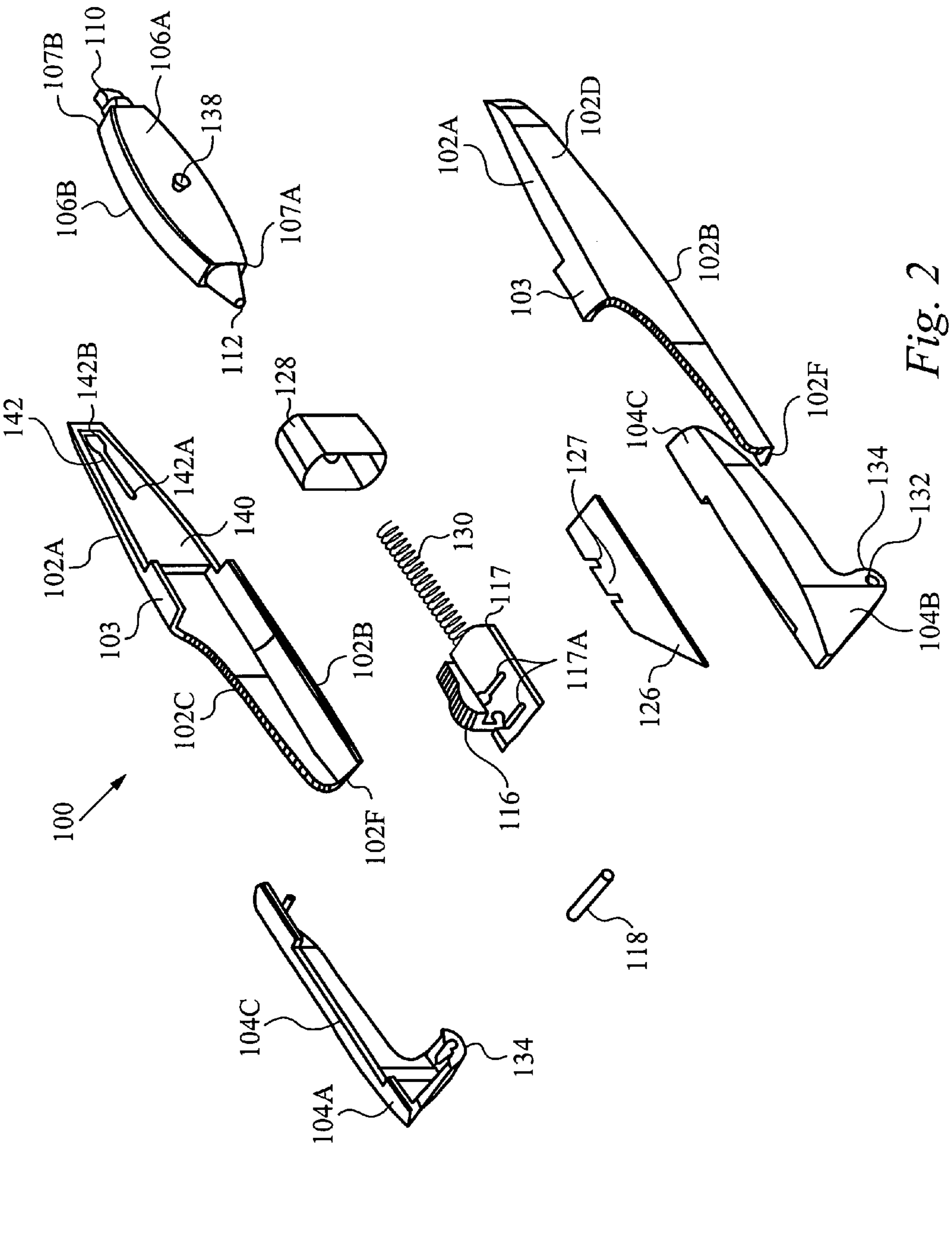
FIG. 2 illustrates an exploded view of an alternate embodiment of the utility tool in accordance with the present invention.
Figure 3:
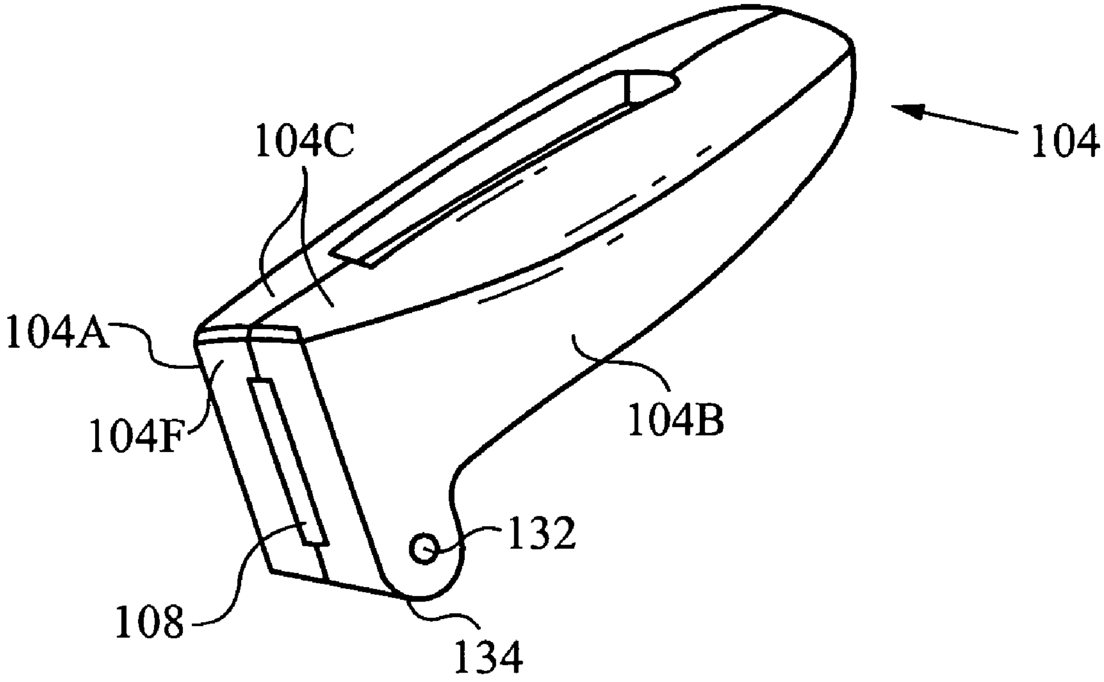
FIG. 3 illustrates a perspective view of an alternate embodiment of the knife compartment in accordance with the present invention.
Figure 4A:
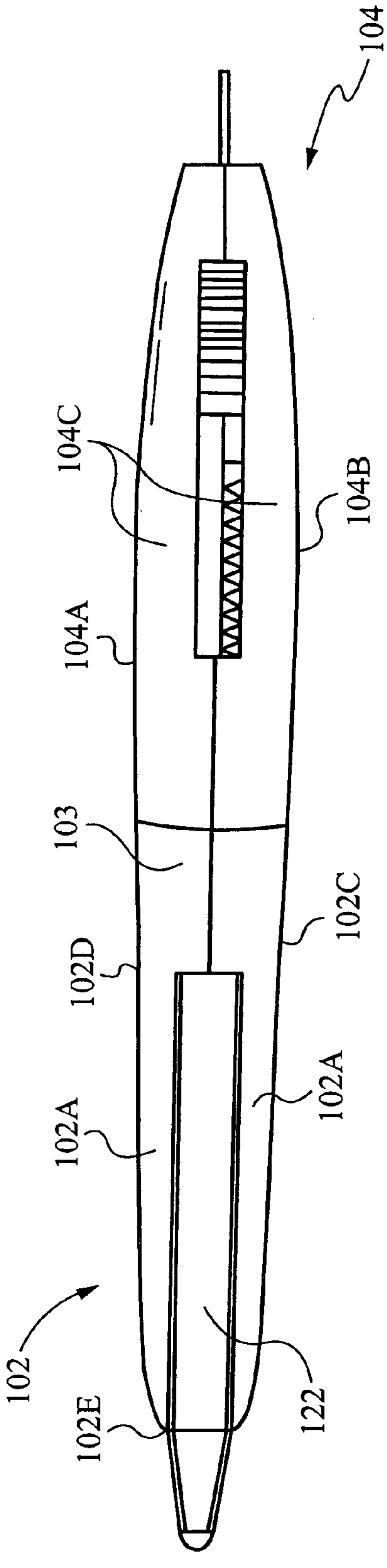
FIG. 4A illustrates a top view of an alternate embodiment of the utility tool in accordance with the present invention.
Figure 4B:
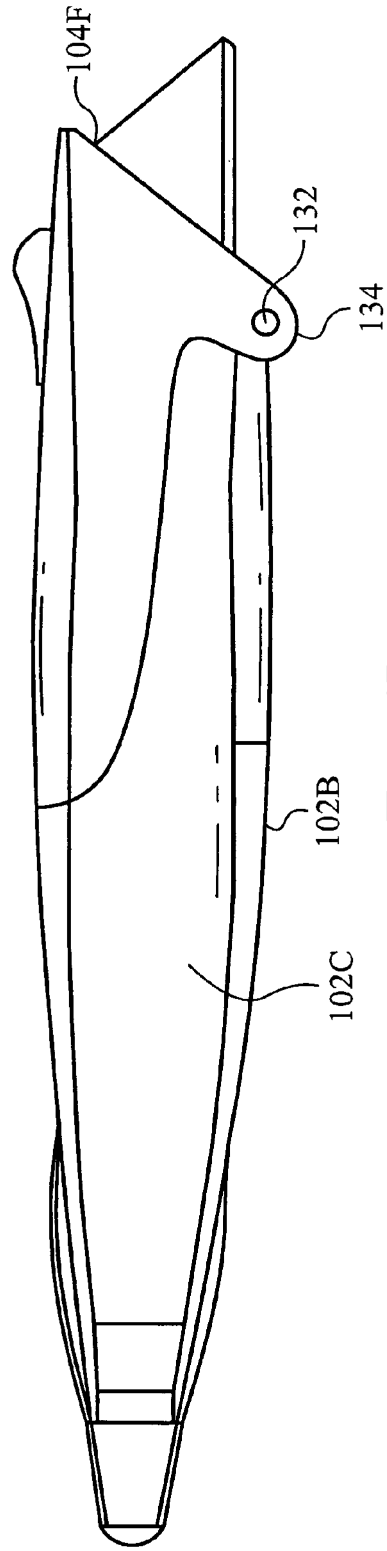
FIG. 4B illustrates a side view of an alternate embodiment of the utility tool in accordance with the present invention.

FIG. 1 illustrates a perspective view of an alternate embodiment of the utility tool 100 in accordance with the present invention. FIG. 2 illustrates an exploded view of the alternate embodiment of the utility tool 100 in accordance with the present invention. FIG. 3 illustrates a perspective view of the alternate embodiment of the knife compartment in accordance with the present invention. FIG. 4A illustrates a top view of the alternate embodiment of the utility tool in accordance with the present invention. FIG. 4B illustrates a side view of the alternate embodiment of the utility tool in accordance with the present invention.

An alternate embodiment of the utility tool 100, generally as shown in FIG. 1, comprises a body 102, a knife compartment 104, a rotatable cartridge unit 106 having a highlighting marker 110 and a pen 112. The highlighting marker 110 and/or the pen 112 are covered by the cap 114. In addition, the utility tool 100, as shown in FIG. 2, contains a knife 126, a pin 118, an interior cap 128, a knife switch 116 with an attached spring feature 130, a platform 117 and knife blade 126.

As shown in FIGS. 4A and 4B, the body 102 or housing of the tool 100 has a top surface 102A, a bottom surface 102B, a right side 102C, a left side 102D, a rear 102E and a front 102F (FIG. 2). Although, the body 102 is made of these two pieces, it should be understood alternatively that the body 102 is made of any appropriate number of pieces, including only one piece. As shown in FIGS. 2 and 4A, the body 102 includes a notch 103 on the top surface 102A of each side which is located midway between the end 102E and the front 102F of the body 102. FIG. 1 shows that the body 102 also includes a cartridge slot 122 which is defined as the space between the end 102E and notch 103. The cartridge slot 122 is also defined as the space between the top surface 102A and the bottom surface 102B, as discussed in more detail below.

The knife compartment 104, as shown in FIGS. 2 and 3, comprises a right side 104A and a left side 104B, wherein the left side 104B and the right side 104A both have a corresponding top surface 104C. The knife compartment 104 includes a front face 104F which is positioned opposite of the end 102F of the body 102. Although the knife compartment 104 is discussed as being separate from the body 102, alternatively, the body 102 and the knife compartment 104 are one integral component of the tool 100. The knife compartment 104 is coupled to the body 102, such that the right side 104A of the knife compartment 104 is configured to be positioned adjacent to the right side 102D of the body 102. Similarly, the left side 104B of the knife compartment 104 is configured to be positioned adjacent to the left side 102D of the body 102.

The knife compartment 104 includes a rounded portion 134 and an aperture 132 in the right side 104A and the left side 104B of the knife compartment 104. The rounded portion 134 is configured to be located near the bottom surface 102B of the body 102. The right side 104A and the left side 104B of the knife compartment 104 are coupled together by a pin 118 which fits into the apertures 132 in the rounded portion 134 of the knife compartment 104. The knife compartment 104, when coupled to the body 102, forms the tool 100. The rounded portion 134 of the knife compartment 104 is positioned underneath the front surface 102F of the body 102 when the knife compartment 104 is coupled to the body 102.

The knife compartment 104 couples to the body 102 by a friction fit, wherein the distance between the inside walls of the knife compartment 104 is slightly smaller than the distance between the right side 102C and left side 102D of the body 102. In an alternate embodiment, the pin 118 maintains the friction fit between the knife compartment 104 and body 102 by holding the right side 104A and the left side 104B of the knife compartment 104 together. Alternatively, other means for holding the right side 104A and the left side 104B together are used. Alternatively, the knife compartment 104 is coupled to the body 102 by screws, snap fit or other means that allows the user to open the knife compartment 104 to remove or exchange knife blades 126. The knife compartment 104 rotates about the pin 118 when moving between the open and closed position.

The front face 104F of the knife compartment 104, shown in FIG. 3, extends from the top surface 104C downward to the rounded portion 134. A knife slot 108 runs along the front face 104F of the knife compartment 104. The knife switch 116 (FIG. 1) is configured to allow the knife or knife blade 126 to be retractable, such that the knife 126 slides between a retracted position and an extended position. The knife 126 is within the knife compartment 104 when in the retracted position, as shown in FIG. 1. Likewise, the knife 126 penetrates out of the knife slot 108 when the knife 126 is in the extended position, as shown in FIGS. 4A and 4B.

In an alternate embodiment, the top surface 104C of the knife compartment 104 has an indented rectangular groove 120 for housing the knife switch 116, as shown in FIG. 1. The knife switch 116 and the attached support platform 117 are coupled to a spring feature 130 which attaches to the body 102, whereby the spring feature 130 urges the knife switch 116 to the retracted position. Thus, the knife switch 116 prevents the knife 126 from unintentionally being left in the extended position. In this alternate embodiment, the knife 126 is easily replaceable from the knife compartment 104. As described above, the knife compartment 104 rotates about the pin 118 between the closed and open position. When the knife compartment 104 is in the open position, both the knife blade 126 and the knife switch 116 are exposed. As shown in FIG. 2, the knife switch 116 is coupled to a support platform 117 which engages the knife blade 126. Specifically, the support platform 117 includes two engaging pins 117A which are configured to engage the knife blade 126, in which the pins 117A fit within the knife blade notches 127. When the knife compartment 104 is in the open position and the knife switch 116 as well as the knife blade 126 is exposed, the user removes the worn out knife blade 126 by disengaging the knife blade notches 127 from the engaging pins 117A. The user then inserts a new knife blade 126 by coupling the engaging pins 117A within the knife blade notches 127. Alternatively, the knife switch 116 with the knife blade 126, attached as one unit, may be completely removed and replaced with another unit containing a new knife switch 116 and knife blade 126. Thus, the knife 126 would be easily changeable with a minimum amount of contact with the knife 126 itself.

As described above, the body 102 has a cartridge slot 122 which is defined as the space from the top surface 102A to the bottom surface 102B of the body 102. The slot 122 has a rectangular shape and passes from the end 102E midway to the notch 103. Both of the inside walls 140 of the body 102 include a track 142 for housing a knob or knob member 138 extending from the cartridge unit 106, as will be discussed in more detail below. Alternatively, only one of the inside walls 140 of the body 102 includes a track 142 for housing the knob 138. The distance of the cartridge slot 122 from the end 102E to the notch 103 is less than the distance between the ends 107A and 107B of the cartridge unit 106. The track 142 allows the cartridge unit 106 to traverse along the body 102 from an inward or first position which is represented as the narrow portion 142A of the track 142, to an outward or second position which is represented as the wide portion 142B of the track 142, as will be discussed below.

The cartridge unit 106 or housing shown in FIGS. 1 and 2 has a substantially rectangular shape. The cartridge unit 106 has a left side 106A and a right side 106B as well as two ends, shown as 107A and 107B. The ends 107A and 107B are configured to be positioned to face away from one another, in which each end 107A, 107B of the cartridge unit 106 has a tool. As shown in FIGS. 1 and 2, the tool is a marking instrument, such as a pen 112 and a highlighter 110, where the pen 112 extends out from the end 107A and the highlighter 110 extends out from the end 107B. Thus, the pen 112 extends out from the cartridge unit 106 in a direction opposite from the marker 110. Alternatively, the cartridge unit 106 is configured to have other instruments, such as a retractable tape measure, flashlight, compass, level, bar code scanner or other accessory, extending out from the ends 107A and 107B.

As shown in FIG. 2, the cartridge unit 106 also has a knob 138 which extends out perpendicularly from the center of both the left side 106A and the right side 106B of the cartridge unit 106. Alternatively, the knob 138 is configured to extend out from only one side of the cartridge unit 106 or extend out from a position other than the center of the cartridge unit 106. The knob 138 allows the cartridge unit 106 to rotate about an axis extending through the knob 138.

The cartridge unit 106 is positioned within the cartridge slot 122. The knob 138 extending from each side of the cartridge unit 106 fits in the track 142 located integrally within the cartridge slot 122. As described above, the cartridge unit 106 is rotatable about the knob 138. Thus, a user rotates the cartridge unit 106 such that the desired end of the cartridge unit 106 faces out from the end 102E of the tool 100. When the desired end of the cartridge unit 106 is in the exposed position or faces out from the end 102E of the tool 100, the end opposite of the desired end is contained within the body 102. For example, if a user desires to use the end 107A having the pen 112, she will rotate the cartridge unit 106 such that the end 107A faces out the rear 102E of the tool 100. As discussed above, the ends 107A and 107B of the cartridge unit 106 are positioned opposite of one another. Thus, the end 107B of the cartridge unit 106 having the highlighting marker 110 is contained within the body 102 of the tool 100 when the end 107A is facing out from the rear 102E of the tool 100. The tool 100 includes an interior cap 128 within the body 102 for providing a cover for and storing the end of the cartridge unit 106 that is not in the exposed position. Thus, in the example, the highlighting marker 110 would be contained within the interior cap 128.

The cartridge unit 106 is removable, such that replacement cartridges are useable with the tool 100. In the alternate embodiment, the cartridge unit 106 is removed from the body 102 by moving the knob member 138 to the wide portion 142B of the track 142. Once the knob member 138 is positioned at the wide portion 142B, the user slightly twists or bends the cartridge unit 106 such that the one or more knob members 138 is no longer within the wide portion 142B. Once the knob member 138 is no longer within the wide portion 142B of the track 142, the user can easily remove the cartridge unit 106 from the body 102. Similarly, to insert a cartridge unit 106, the user slightly twists or bends the cartridge unit 106 until the one or more knob members 138 are positioned within the wide portion 142B. Alternatively, the cartridge unit 106 is inserted or removed from the body 102 by applying a force on the inside walls 140 of the body 102 such that the walls 140 slightly move away from each other. Causing the walls 140 to move away from each other allows the knob member 138 enough clearance to be inserted into or removed from the wide portion 142B of the track 142.

In an alternate embodiment of the present invention, to assemble the tool 100, the left side 102D and the right side 102C of the body 102 are snapped together by a snap tight fit. Alternatively, the sides 102C and 102D of the body 102 are assembled together by other means, such as adhesive, screw, or other equivalent. The interior cap 128 is placed between the sides 102C and 102D of the body 102 and held within the body 102 when the sides are snapped together. The cartridge unit 106 is coupled to the body 102, by inserting the knob 138 into the wide portion 142B of the track 142 located within the inside walls 140 of the cartridge slot 122. The knife compartment 104 is coupled to the body 102 by a snap fit, such that the rounded portion 134 of the knife compartment 104 is positioned substantially near to the front end 102F of the body. Alternatively, the knife compartment 104 couples to the body 102 by other means, such as adhesive, screw, or other equivalent.

The knife compartment 104 is assembled by coupling the right side 104A and the left side 104B together by a snap fit. The right side 104A and the left side 104B of the knife compartment 104 are held together by the cover pin 118 which fits within the aperture 132 that extends through each side of the knife compartment 104. Alternatively, the knife compartment 104 is assembled together by other means, such as adhesive, screw, or other equivalent. Also, the knife switch 116 is placed within the knife compartment 104, such that the grooved portion of the knife switch 116 protrudes out from the switch groove 120. As described above, the knife switch 116 is coupled to a platform 117 which includes the two engaging members 117A. The engaging members 117A are coupled to the notches 127 of the knife blade 126. Thus, when the knife switch 116 moves to the extended position, the knife blade 126 is exposed through the knife slot 108. On the other hand, when the knife switch 116 moves to the retracted position, the knife blade 126 is within the knife compartment 104. The platform 117 couples to the spring 130 which attaches to a stationary point within the tool 100. The spring 130 biases the knife switch 116 to the retracted position within the knife compartment 104 of the tool 100 and prevents the knife blade 126 from being unintentionally left in the extended position.

To use the knife portion of the tool 100, a user simply presses the knife switch 116 toward the front end 104F of the knife compartment 104. The knife switch 116 allows the knife 126 to slidably move from the retracted position to the extended position, because the knife 126 is coupled to the platform. The knife blade 126 stays in the extended position as long as pressure is applied by the user. Alternatively, a switch or locking mechanism may be used to lock the knife 126 in the extended position. As stated above, the knife switch 116 biases the knife 126 toward the retracted position, to prevent the knife 126 from being unintentionally left in the extended position.

A user also uses the cartridge unit 106 in the tool 100 to mark items as the user desires. As stated above, the cartridge unit 106 has two ends, 107A and 107B, each having a different tool, respectively a pen 112 and a highlighter marker 110. If the user wants to use the pen 112, she pulls the cartridge unit 106 out along the track 142 toward the end 102E. As stated above, the length of the slot 122 is less than the distance between the ends 107A and 107B of the cartridge unit 106. Thus, once the cartridge unit 106 is substantially near or in the outer portion 142B of the track 142, there is enough distance to allow the cartridge unit 106 to rotate. The ability for the cartridge unit 106 to rotate allows the end 107A of the cartridge unit 106 to face out from the end 102E of the tool 100. When the end 107A of the cartridge unit 106 faces out the rear of the tool 100, the user pushes the cartridge unit 106 along the track 142 away from the end 102E of the body 102, until the end 107B is contained within the body 102. Thus, the cartridge unit is locked, and the end 107B of the cartridge unit 106 having the highlighting marker 110 will be contained within the body 102 when the end 107A is facing out the rear 102E of the tool 100. As stated above, the tool 100 includes an interior cap 128 within the body 102 for storing the end 107 of the cartridge unit 106 that is not in the exposed position. Thus, in the alternate example, the highlight marker 110 would be contained within the interior cap 128.

Similarly, if the user prefers to use the highlighter marker 110, she pulls the cartridge unit 106 out along the track 142 toward the end 102E such that the cartridge unit 106 has enough clearance within the slot 122 to rotate. At this point, the knob 138 of the cartridge unit 106 is substantially near or in the outer portion 142B of the track 142. The user then rotates the cartridge unit 106 such that the end 107B having the highlighting marker 110 faces out from the end 102E of the tool 100. The user then pushes the cartridge unit 106 along the track 142 away from the end 102E of the body 102, until the end 107A is contained within the body 102. Thus, the cartridge unit 106 is locked, and the end 107A of the cartridge unit 106 having the pen 112 will be contained within the body 102 of the tool 100 when end 107B is facing out the rear 102E of the tool 100. As noted above, the cartridge unit 106 alternatively has one or more of an array of tools which extend out from ends 107A and 107B, such as a retractable tape measure, flashlight, compass, level or other accessory. In addition, the tool 100 of the present invention can be made of a soft elastomeric overmolding material. Alternatively, the tool 100 is made of any rigid material, such as hard plastic, metal, stainless steel, or other equivalent.

Figure 5:
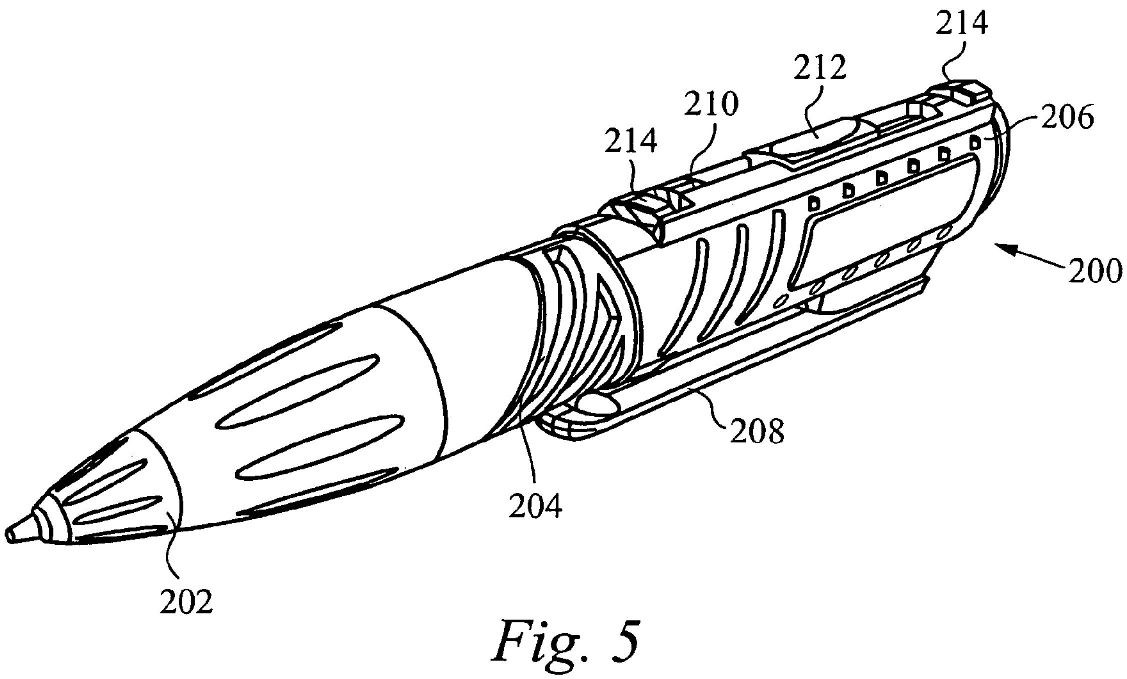
FIG. 5 illustrates a perspective view of an alternate embodiment of the knife compartment in accordance with the present invention.

FIG. 5 illustrates a perspective view of an alternate embodiment of the utility tool in accordance with the present invention. Generally, the utility tool 200 includes a pen capsule 202, a highlighter capsule 204, a knife compartment 206, a pocket clip 208 as well as a blade cartridge 210 having a knife blade switch 212 and two blade cartridge leafs 214.

Figure 6A:
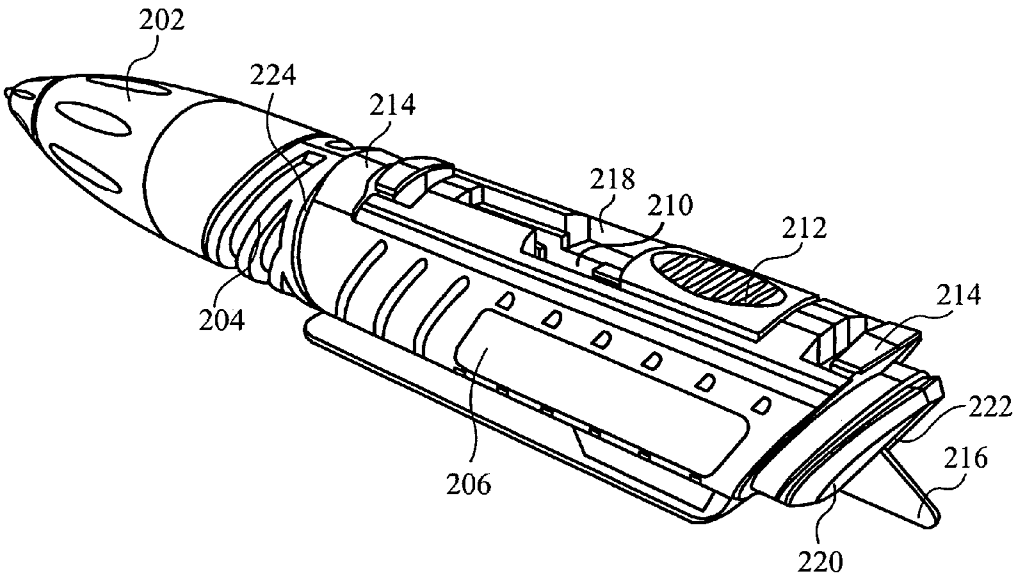
FIG. 6A illustrates a perspective view of an alternate embodiment of the utility tool in accordance with the present invention.

FIG. 6A illustrates a perspective view of an alternate embodiment of the utility tool in accordance with the present invention. In particular, FIG. 6A illustrates a more detailed view of the knife compartment 206 which includes the blade cartridge 210. The knife compartment 206 has a generally cylindrical shape and two ends 220, 224 in which the end 220 includes a blade slot 222 and the end 224 receives the highlighter capsule 204 and/or the pen capsule 202, as will be described in detail below. It should be noted that the end 220 of the knife compartment 206 is also preferably configured to receive the pen capsule 202 (not shown).

Figure 12:
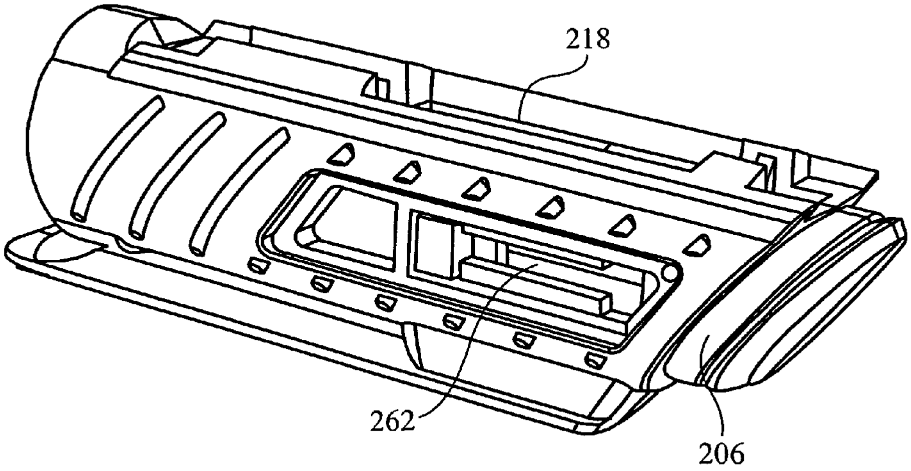
FIG. 12 illustrates a perspective view of the knife compartment of the present invention.

As shown in FIG. 6A, the blade cartridge 210 contains a knife blade 216 and is preferably removable from the utility tool 200 as will be discussed below. The blade cartridge 210 couples to the knife compartment 206 by fitting within the blade cartridge bay 218, which is defined as the space within the knife compartment 206 that is exposed on the outer surface of the knife compartment (FIG. 12). The leafs 214 on both sides of the blade cartridge 210 press against the inside walls of the blade cartridge bay 218, thereby securing the blade cartridge 210 to the blade cartridge bay 218. The blade cartridge 210 also includes a knife switch 212 coupled to the knife blade 216 which moves between a first position and a second position. As shown in FIG. 6A, the knife switch 212 is in a position such that the knife blade 216 is extending out of the blade slot 222. In contrast, FIG. 5 illustrates the knife switch 212 in a position that the knife blade 216 does not extend out of the blade slot 222.

Figure 6B:
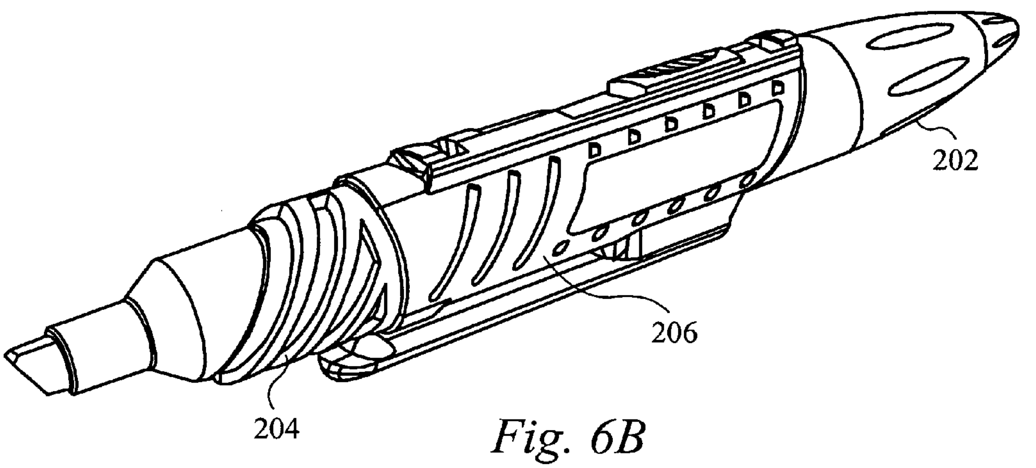
FIG. 6B illustrates a perspective view of an alternate embodiment of the utility tool in accordance with the present invention.
Figure 7:
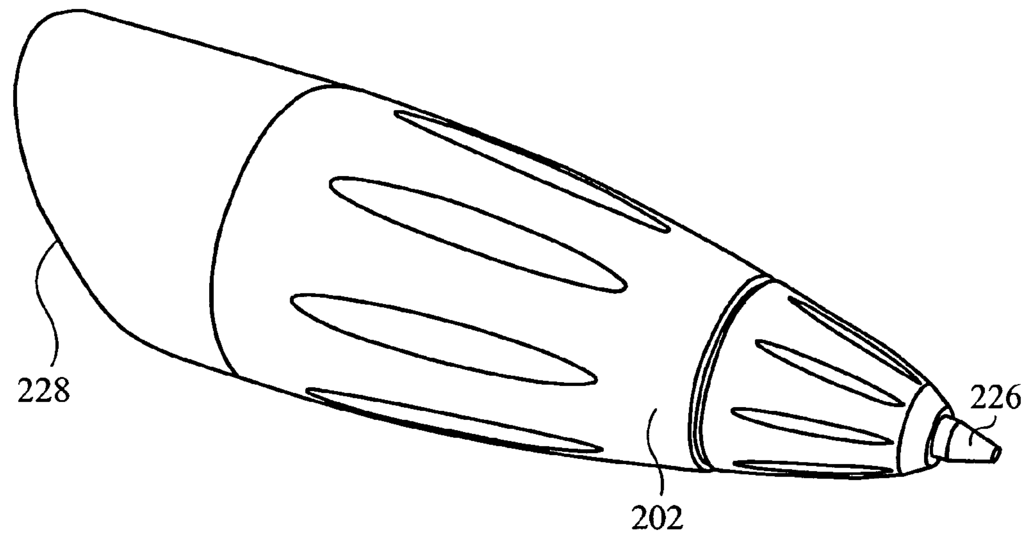
FIG. 7 illustrates a perspective view of the pen capsule 202 of the preferred embodiment in accordance with the present invention.

FIG. 7 illustrates a perspective view of the pen capsule 202 of an alternate embodiment of the present invention. The pen capsule 202 has a pen tip 226 which is retractable within the pen capsule 202. Although this discussion preferably refers to the capsule 202 as a pen capsule, it is understood that the capsule 202 is alternatively any other appropriate type of writing tool, including, but not limited to a marker, highlighter and pencil. In addition, the pen capsule 202 includes a coupling end 228 which engages to the highlighter capsule 204, as shown in FIGS. 5 and 6A–B. Also, the coupling end 228 allows the pen capsule 202 to be engaged to either of the ends 220 or 224 of the knife compartment 206 (FIG. 6B). The coupling end 228 of the pen capsule 202 preferably provides a friction fit with either the highlighter capsule 204 or the ends 220, 224. Alternatively, the coupling end 228 engages the highlighter capsule 204 or the ends 220, 224 by screwing the coupling end 228 thereto or any other known methods.

Figure 8:
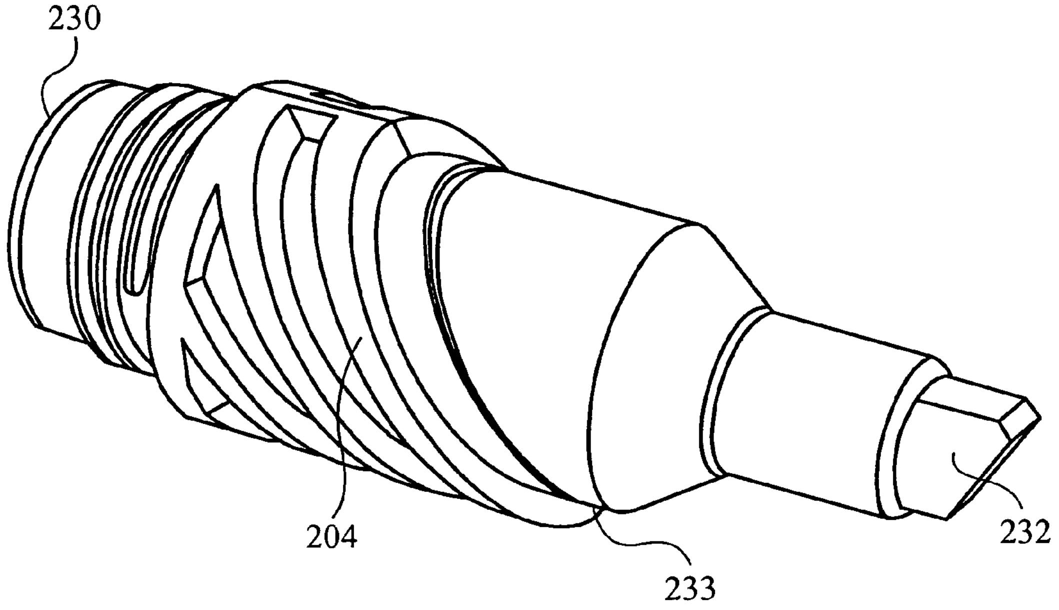
FIG. 8 illustrates a perspective view of the highlighter capsule 204 of the preferred embodiment in accordance with the present invention.

FIG. 8 illustrates a perspective view of the highlighter capsule 204 of an alternate embodiment of the present invention. The highlighter capsule 204 preferably has a highlighter tip marker 232. Although this discussion refers to the capsule 204 as a highlighter capsule, it is understood that the capsule 204 is alternatively any other type of tool. For instance, the capsule 204 is alternatively another writing tool, including but not limited to a pen or pencil. Alternatively, the capsule 204 is a measuring tool such as a retractable tape measure, flashlight, compass, level, bar code scanner or other accessory. In addition, the highlighter capsule 204 includes a coupling end 233 which engages to the pen capsule 202 (FIG. 5). Also, the coupling end 230 engages the highlighter capsule 204 to the end 224 of the knife compartment 206. It is preferred that the coupling end 230 screws to the end 224, although any other appropriate coupling means may be used.

Figure 9A:
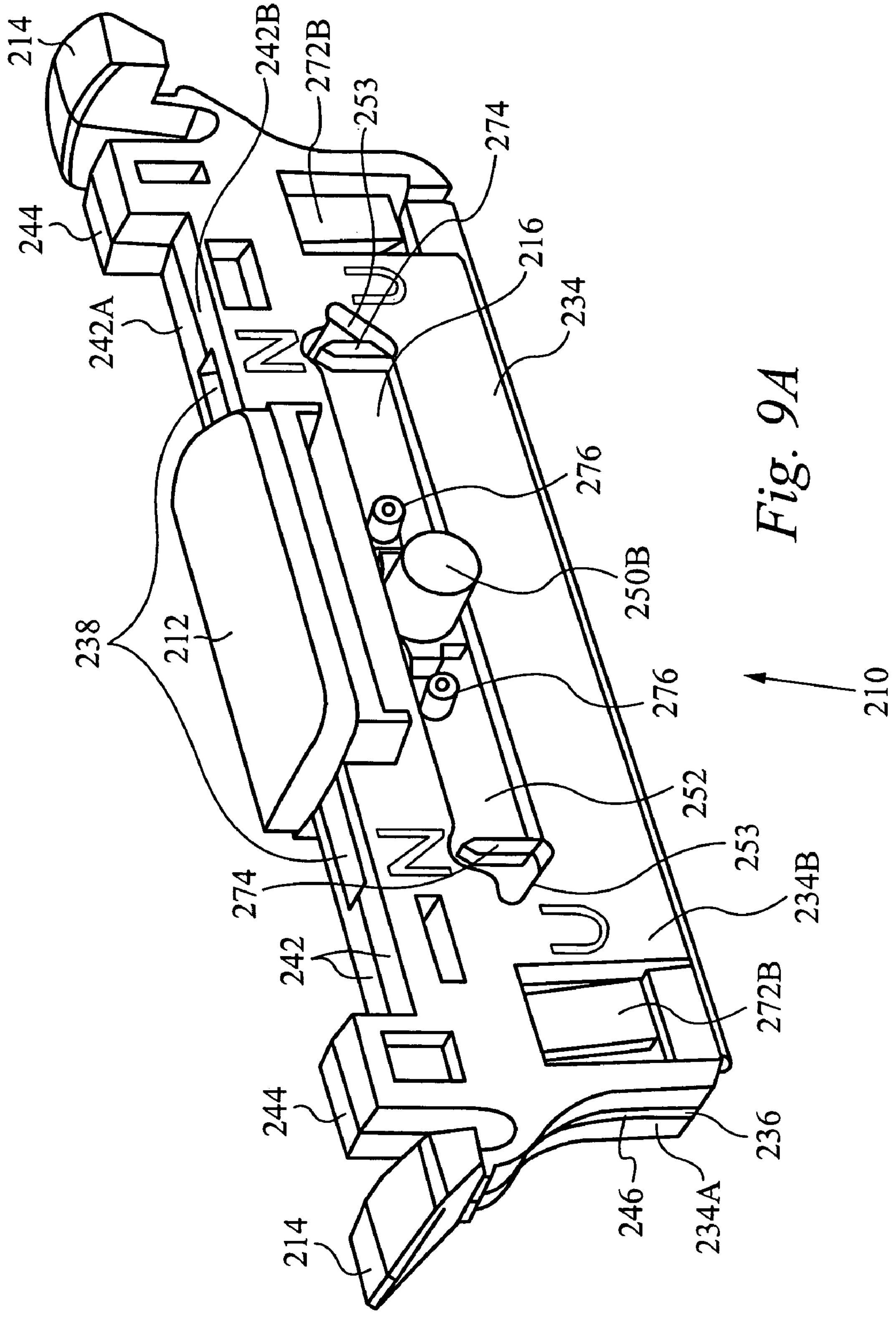
FIG. 9A illustrates a perspective view of the blade cartridge of an alternate embodiment in accordance with the present invention.

FIG. 9A illustrates a perspective view of the blade cartridge 210 of an alternate embodiment of the present invention. Preferably, the blade cartridge 210 includes a blade cartridge body 234 having a track groove 238 as well as a guide window 252, a knife switch 212, a knife blade 216 within, a pair of leafs 214 and a guide mechanism 250. Alternatively, the blade cartridge 210' (FIG. 10A) includes the above components as well as a safety spring 248 as is discussed below.

The blade cartridge 210 shown in FIG. 9A includes a blade cartridge body 234 having two body sides 234A, 234B. Each body side 234A, 234B is coupled to one another to form the blade cartridge body 234, whereby the body sides 234A, 234B are preferably generally parallel to each other. It is preferred that the body sides 234A, 234B are formed from one molded plastic piece and stamped to form the blade cartridge body 234. Alternatively, the body sides 234A, 234B are separate pieces that are coupled to one another to form the blade cartridge body 234. Each body side 234A, 234B has a respective top surface 242A, 242B, whereby coupling the body sides 234A, 234B to one another forms a combined top surface 242.

The top surface 242 of the blade cartridge body 234 includes a track groove 238 which allows the knife switch 212 to laterally move between the first and second position when the blade cartridge 210 is in an active state. The blade cartridge 210 is configured to be in an active and a non-active state preferably for safety reasons. When the blade cartridge 210 is in the active state, the knife 216 is able to laterally move between the first and second position. In contrast, the knife 216 is not able to laterally move between the first and second position when the blade cartridge 210 is in the non-active state. The top surface 242 of the blade cartridge body 234 preferably includes two tab members 244 located on each end of the blade cartridge body 234. The tab members 244 serve as barriers for the knife switch 212, such that the knife switch 212 does not move past the tab members 244 when the blade cartridge 210 is in the active state. Details regarding the active state and non-active state of the blade cartridge 210 will be discussed in more detail below.

The blade cartridge 210 also includes a recess 236 which is defined as a space in between the body side 234A and the body side 234B. The recess 236 houses the knife blade 216 and preferably passes along the entire length of the blade cartridge body 234. The blade cartridge body 234 preferably includes a knife slot 246 located on each end of the blade cartridge body 234, wherein the knife slot 246 is in communication with the recess 236. Alternatively, a knife slot 246 is located at only one end of the blade cartridge body 234. The knife slot 246 is also in communication with the blade slot 222 (FIG. 6A). The knife blade 216 moves along the recess 236 between a closed or retracted position and an open or extended position, whereby the knife blade 216 extends out through the knife slot 246 and the blade slot 222 (FIG. 6A) when in the extended position. The knife blade 216 is coupled to the knife switch 212, as shown in FIG. 9A, in which the knife switch 212 laterally moves along the track groove 238 between the first position and the second position, whereby the knife blade 216 correspondingly moves between the retracted and the extended positions. Alternatively, the knife switch 212 only moves laterally towards one end whereby the knife blade 212 moves in that same one direction.

Figure 10A:
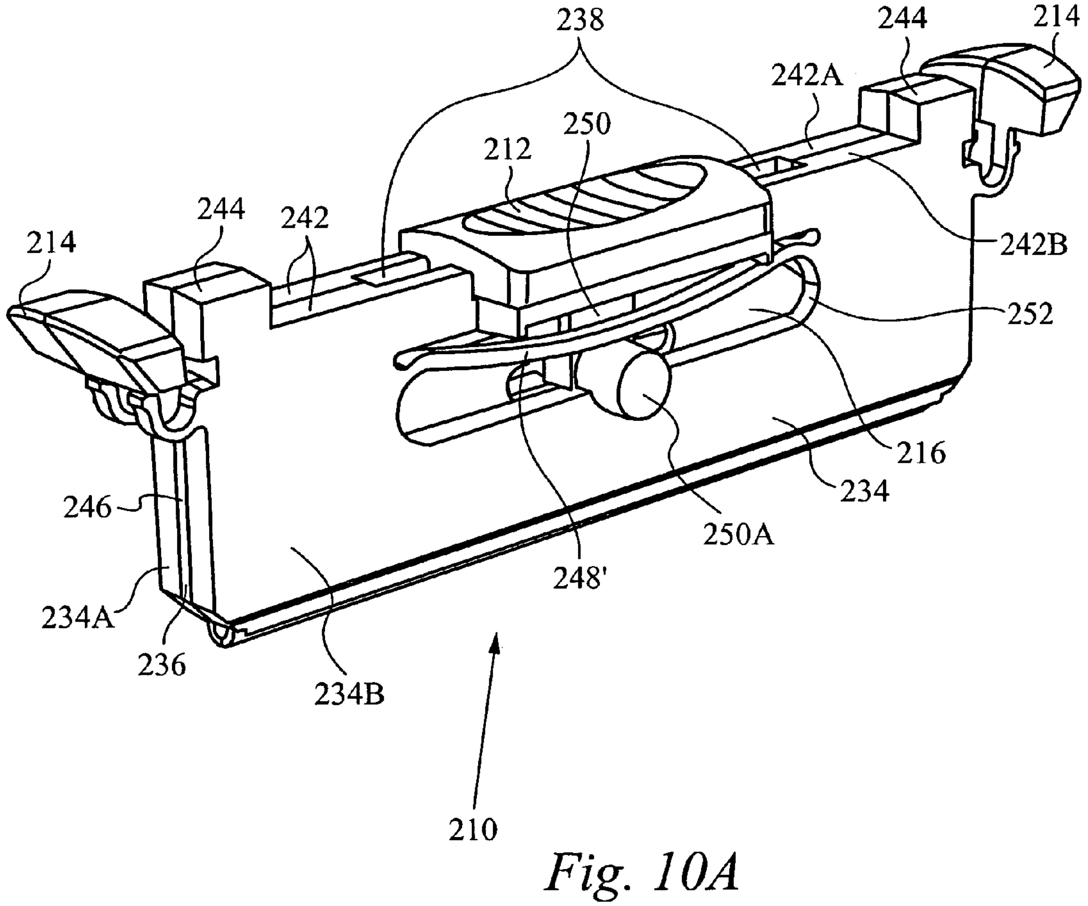
FIG. 10A illustrates a perspective view of the blade cartridge of an alternative embodiment in accordance with the present invention.

In addition, the blade cartridge 210 preferably includes two leafs 214 which secure the blade cartridge 210 within the blade cartridge bay 218. Alternatively, the blade cartridge 210 has only one leaf 214. Each leaf 214, shown in FIGS. 9A and 10A, is configured to provide a snap fit engagement between the blade cartridge 210 and the interior walls of the blade cartridge bay 218. In inserting the blade cartridge 210 into the blade cartridge bay 218, each leaf 214 snaps and secures the blade cartridge 210 into place, as illustrated in FIGS. 6A–B. The friction fit between the leaf 214 and its respective inner wall, as shown in FIGS. 6A–B, secures the blade cartridge 210 to the blade cartridge bay 218. In disengaging the blade cartridge 210 from the blade cartridge bay 218, each of the leafs 214 are actuated toward each other to create enough clearance to allow the user to pull the blade cartridge 210 out of the blade cartridge bay 218. Each leaf 214 is preferably made of the same material as the blade cartridge body 234A, 234B and has a spring-like characteristic. It should be noted that securing of the blade cartridge 210 to the blade cartridge bay 218 is not limited to the above discussion and may alternatively encompass other assembly types.

The blade cartridge 210 is configured to be in an active state and a non-active state. When in the non-active state, the knife switch 212 is set within the stop groove, as shown in FIG. 9, and is unable to move laterally in any direction. Preferably, the blade cartridge 210 is in the non-active state when the blade cartridge 210 is not engaged within the blade cartridge bay 218 (FIG. 6A) of the knife compartment 206. Preferably, once the blade cartridge 210 is engaged within the blade cartridge bay 218 (FIG. 6A) of the knife compartment 206, the blade cartridge is placed into the active state. When the blade cartridge 210 is in the active state, the knife switch 212 is able to move along the track groove 238, whereby the knife switch 212 preferably drives the knife blade 216 to move between the retracted and extended positions.

The details of the active state and the non-active state of the blade cartridge 210 will now be discussed in conjunction with FIGS. 9–13. An alternate embodiment of the blade cartridge 210, shown in FIG. 9A, includes two tabs 272B formed integrally within the blade cartridge body 234B. Although not shown in FIG. 9A, it is preferred that two tabs 272A (not shown) are also integrally formed within the blade cartridge body 234A. Specifically, one end of tab 272A, 272B, shown in FIG. 9A as the top end, is attached to the corresponding blade cartridge body 234A, 234B, respectively. The other end of tab 272A, 272B, shown in FIG. 9A as the bottom end, is configured such that the bottom ends slant inward toward each other. The bottom ends of the tabs 272A and 272B are configured to preferably lock to each other, whereby the tab notch 273 (FIG. 10B) restricts forward movement of the knife blade 216. This locked configuration thereby prevents the knife blade 216 from moving laterally in either direction along the blade cartridge 210 when the blade cartridge 210 is in the non-active state or is not engaged within the blade cartridge bay 218. However, the tabs 272A, 272B are configured such that the bottom ends separate and move rotate away from each other when the blade cartridge 210 is engaged within the blade cartridge bay 218, as shown in FIG. 9B.

Figure 9B:
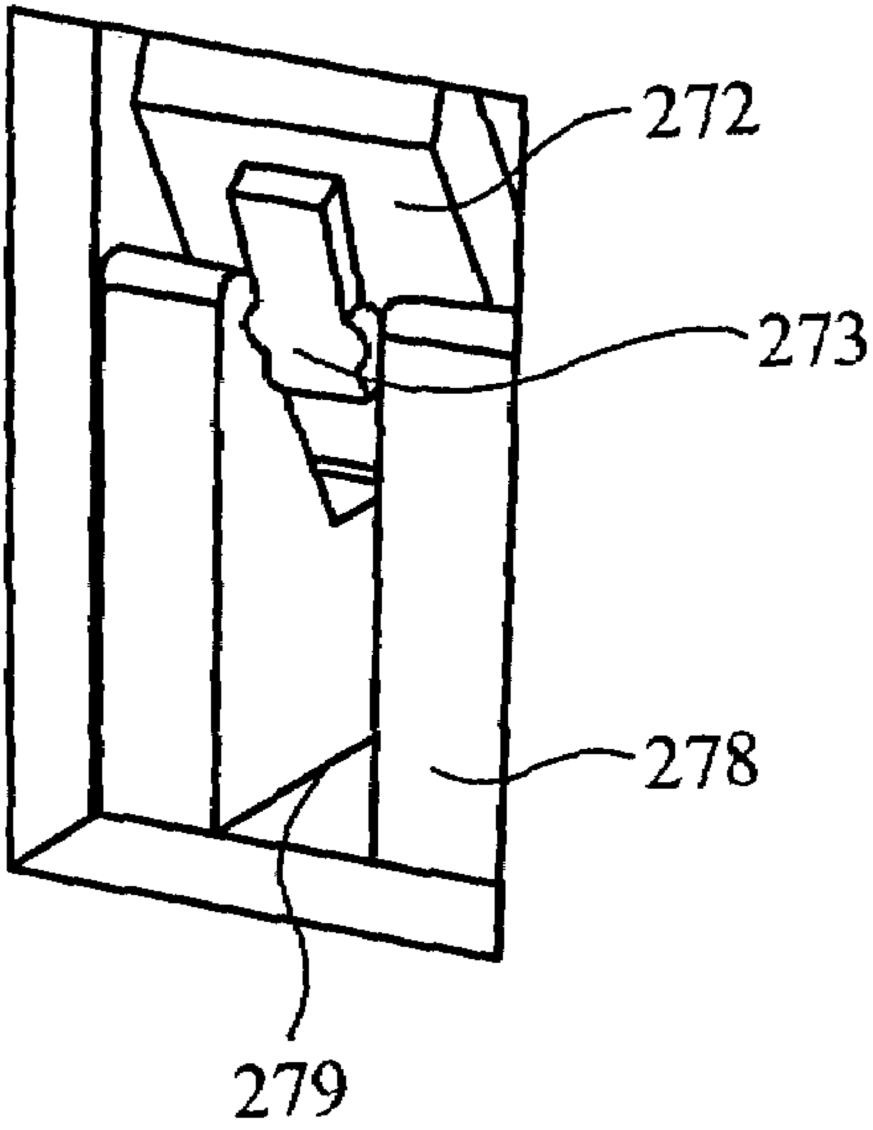
FIG. 9B illustrates a cut out view of the blade cartridge tabs coupled with the knife compartment ribs of an alternate embodiment in accordance with the present invention.

FIG. 9B illustrates a cut out view of one of the blade cartridge tabs 272 coupled with the tab separator 278 of an alternate embodiment of the present invention. As shown in FIG. 9B, the inner surface of the tab 272 includes a tab notch 273 which protrudes therefrom. FIG. 9B also shows a tab separator 278, which is configured to be within the knife compartment 206 (not shown). It is preferred that the knife compartment of the present invention includes a tab separator 278 on each side to engage the corresponding tabs 272A, 272B. The tab separator 278 has a separator groove shown in FIG. 9B as reference numeral 279, whereby the tab notch 273 fits within the separator groove 279. The separator groove 279 engages the tab notch 273 and forces the tab 272 away from the tab 272 located on the other side of the blade cartridge when the blade cartridge 210 is inserted within the blade cartridge bay 218. The movement of the tabs 272A, 272B away from one another puts the blade cartridge 210 in the active state, because the tab notches 273 no longer restrict forward movement of the knife blade 216.

Figure 10B:
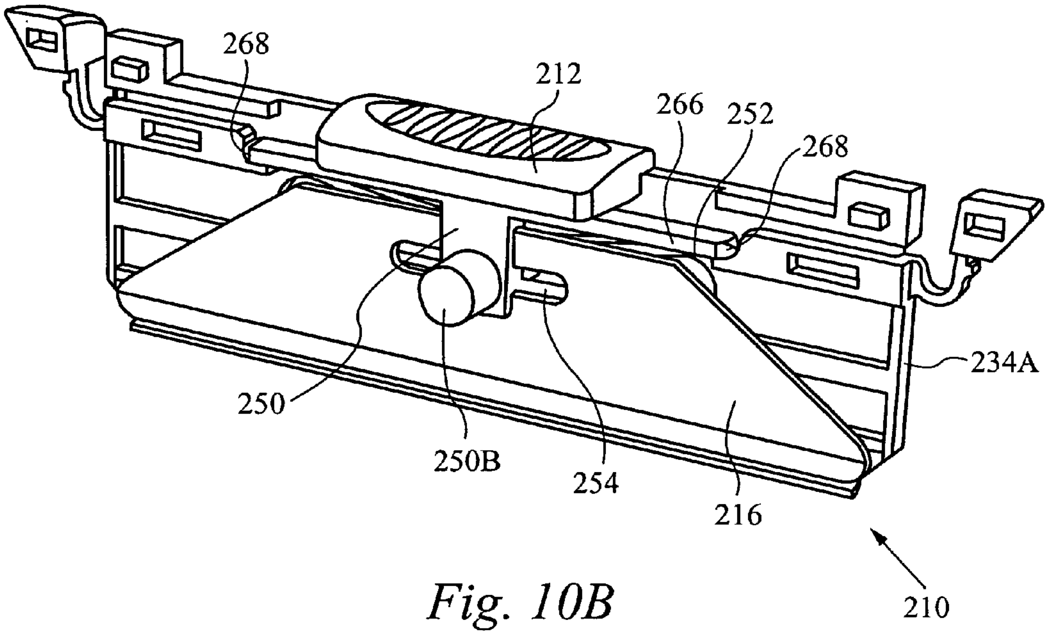
FIG. 10B illustrates a perspective, cut-away view of the blade cartridge of an alternate embodiment in accordance with the present invention.

The alternative embodiment of the blade cartridge body 234 includes a stop groove 240 (FIG. 11) located on the top surface 242 of the blade cartridge body 234 and located midway along the track groove 238. The stop groove 240 (FIG. 11) is of sufficient size such that the knife switch 212 is able to completely fit within the stop groove 240 (FIG. 10A) when the blade cartridge 210 is in the non-active state. FIG. 10B illustrates a perspective, cut-away view of the blade cartridge of the embodiment in accordance with the present invention. The blade cartridge 210 includes a guide assembly or mechanism 250 which places the blade cartridge 210 in the active and non-active states as well as drives the knife switch 212 and the knife blade 216 between the retracted and extended positions. Preferably, the guide mechanism 250 is a component of the knife switch 212 itself and includes two boss members 250A (FIG. 10A) and 250B (FIG. 10B). Alternatively, the guide mechanism 250 is a separate piece and includes only one boss member, whereby the guide mechanism 250 is coupled to the knife switch 212. Either of the boss members 250A, 250B preferably registers through a blade aperture, which is defined as the space shown as reference number 254 in FIG. 10. As shown in FIG. 10A, the boss member 250A preferably registers through the guide window 252 of the blade cartridge 210, whereby the boss member 250A is capable of moving laterally in either direction along the guide window 252 when the blade cartridge 210 is in the active state.

Figure 11:
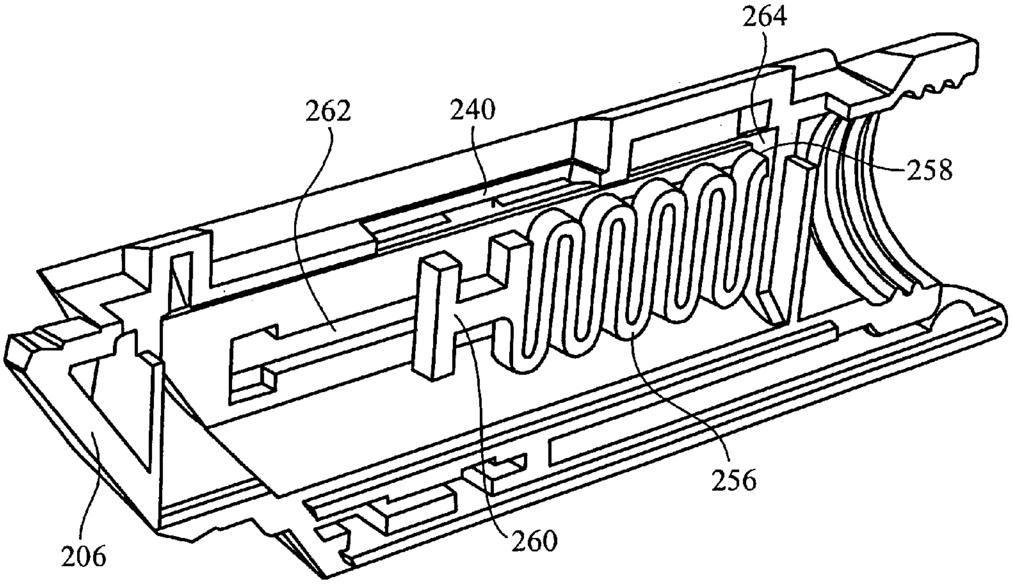
FIG. 11 illustrates a perspective cut-away view of the knife compartment of an alternate embodiment present invention.

As shown in FIG. 10A, the safety spring 248 within the guide window 252 functions to place the blade cartridge 210' in the non-active state when the blade cartridge 210 is not coupled to the knife compartment 206. Both sides 234A, 234B of the blade cartridge 210 include a safety spring 248. Alternatively, only one side of the blade cartridge 210 includes a safety spring 248. In the non-active state, the safety spring 248 applies a default downward force on the boss member 250A, such that the guide mechanism itself 250 is also pressed downward. This causes the knife switch 212 to be confined within the stop groove 240 (FIG. 11). In addition, the guide mechanism 250 includes a guide bar 266 which is shown in FIG. 10 as being located underneath the knife switch 212. In the non-active state, the guide bar 266 rests on the stop groove ledges 268, shown in FIG. 10 and lodged in between the stop groove ledges 268. As a result, the knife switch 212 and the knife blade 216 are prevented from moving in a lateral direction when in the non-active state. The safety spring 248 is made of molded plastic, which is the same as the blade cartridge 210 itself. Alternatively, the safety spring 248 is made of any other resilient material having spring-like characteristics.

Figure 13:
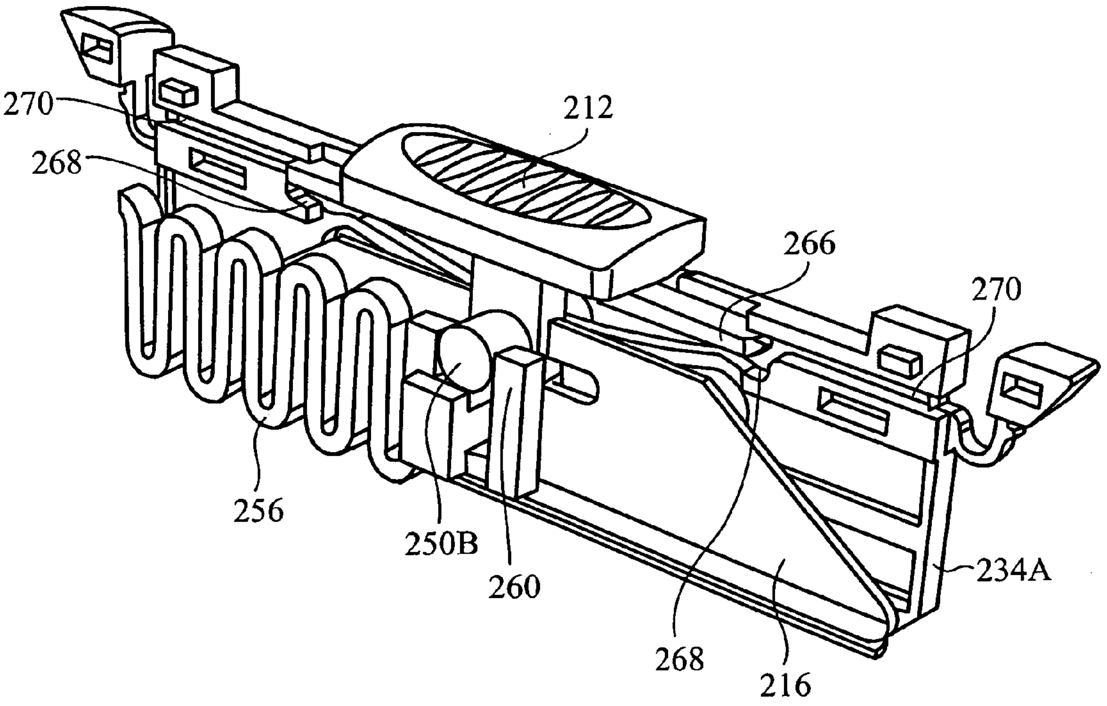
FIG. 13 illustrates a perspective cut away view of the blade cartridge of an alternate embodiment of the present invention.

FIG. 11 illustrates a perspective cut-away view of the knife compartment of the present invention. FIG. 12 illustrates a perspective view of the knife compartment of the present invention. As shown in FIG. 11, the knife compartment 210 includes a guide spring 256 located inside the knife compartment 206. The guide spring 256 has a fixed end 258 which is permanently attached to an inside surface 264 of the knife compartment 210 and an engaging end 260 which registers with a lateral groove 262, as shown in FIGS. 11 and 12. As shown in FIGS. 11 and 12, the lateral groove 262 is formed within the side of the knife compartment 206 and allows the guide spring 256 to move laterally along the length of the lateral groove 262. The guide mechanism 250 (FIG. 9) is coupled to the guide spring 256, whereby the guide spring 256 places the blade cartridge 210 in the active/non-active state as well as provides smooth lateral motion of the guide mechanism 250 along the track groove guide 270, as illustrated in FIG. 13. To address safety issues with the tool 200, the guide spring 256 automatically urges the guide mechanism 250, and thus the knife blade 216, to the first and retracted positions. Therefore, the knife blade 216 will stay in the extended position only when the user urges the knife switch 216 toward the second position. Otherwise, the guide spring 256 will urge the knife blade 216 to retract inside the knife compartment 206, when the user is not pushing the knife switch 216 toward the second position. Alternatively, the knife blade 216 is not spring urged to the retracted position by the guide spring 256.

As stated above, the guide spring 256 places the blade cartridge 210 in the active/non-active state. The engaging end 260 of the guide spring 256 has a “U” shaped receptor, whereby the boss member 250B fits within the “U” shaped receptor of the engaging end 260, as shown in FIG. 13. The guide spring 256 is configured to rest at a position in which the boss member 250B automatically fits within the “U” shape of the guide spring's 256 engaging end 260 when the blade cartridge 210 is inserted within the blade cartridge bay 218 (FIG. 12). The guide spring 256 is also positioned at a predetermined height within the knife compartment 210 such that the guide spring 256 applies an upward force to the guide mechanism 250. This upward force from the guide spring 256 places the blade cartridge 210 into the active state by exceeding the opposing downward force applied by the safety spring 248 to the guide mechanism 250.

FIG. 13 illustrates a perspective cut away view of the blade cartridge of the alternate embodiment of the present invention. As discussed above, the blade cartridge 210 is put into the active state when the blade cartridge 210 is inserted into the blade cartridge bay 218 (FIG. 12) of the knife compartment 206. FIG. 13 presents the inner workings of the blade cartridge 210 in the active state. As discussed above, the blade cartridge 210 is in the non-active state due to the force applied to the guide mechanism 250 by the safety spring 248. As stated above, the guide spring 256 is positioned at a predetermined height within the knife compartment 206 to apply an upward force to the guide mechanism 250. This upward force is sufficient to overcome the opposing downward force applied by the safety spring 248.

As shown in FIG. 13, in the active state, the guide mechanism bar 266 is lifted off the stop groove ledges 268 and placed in communication with the track groove guide 270. Also, the knife switch 212 is lifted from the stop groove 240 and able to move laterally along the track groove 238. Thus, the guide mechanism bar 266 fits within the track groove guide 270 and allows the guide mechanism 250 to move between the first and second positions. It should be noted that although the guide mechanism 250 preferably applies an upward force, it is not limited to an upward force. Thus, the guide mechanism 250 alternatively applies a downward force, which is opposite of an upward force applied by the safety spring 248.

It is preferred that the blade cartridge 210 of the present invention be easily disposable. As shown in FIG. 9A, a thin rib 274 is preferably configured within the guide window 252 of the blade cartridge 210 and initially molded to the blade cartridge body 232B. As shown in FIG. 9A, the thin rib 274 is initially attached to the blade cartridge body 234B and positioned in an upright manner toward the "N" for "New" position. The thin rib 274 is configured to be detached or disengaged from the blade cartridge body 234 when a guide arm 276 pushes the thin rib 274 from the upright or "N" position to the "U" position. This occurs after the knife blade 216 is activated and pressed in the direction of the thin rib 274 for the first time. In other words, the guide arm forces the thin rib 274 into the used position 253 after the first use of the knife blade 216. Preferably, the guide window 252 includes a thin rib 274 on each end. Alternatively, the thin rib 274 is attached on only one end of the guide window 252. As stated above, the knife blade 216 preferably moves laterally in either direction in the blade cartridge 210 wherein the knife blade 216 extends out either knife slot of the blade cartridge 210. Therefore, both ends of the blade cartridge 210 and knife blade 216 can be used. Once one side of the knife blade 216 becomes dull or no longer usable, the blade cartridge 210 can be removed and re-inserted such that the non-used knife slot is positioned to be in communication with the blade slot 222. Once the other side of the knife blade 216 is dull or no longer usable, the user will know to dispose of the blade cartridge 210 because both thin ribs 274 will have been moved into the used position 253. Alternatively, a thin film of material (not shown) covers the knife slot 246 (FIG. 9) of the blade cartridge 210, whereby the thin film (not shown) is pierced by the knife blade 212 after the first use of the knife blade 212. The knife slot 246 on each end of the blade cartridge body 234 includes the thin film of material (not shown). Alternatively, the thin film of material is placed on only one of the knife slots 246. As stated above, the knife blade 216 moves laterally in either direction in the blade cartridge 210 wherein the knife blade 216 extends out either knife slot of the blade cartridge 210. Therefore, both ends of the blade cartridge 210 and knife blade 216 can be used. Once one side of the knife blade 216 becomes dull or no longer usable, the blade cartridge 210 can be removed and re-inserted such that the non-used knife slot is positioned to be in communication with the blade slot 222. Once the other side of the knife blade 216 is dull or no longer usable, the user will know to dispose of the blade cartridge 210 because both thin films of material will have been already pierced.

The assembly of an alternate embodiment of the tool of the present invention will now be discussed. The knife compartment 206 is assembled by coupling the two sides of the knife compartment together. The highlighter cap 204 is then coupled to the end 224 of the knife compartment 206. The pen cap 202, as shown in FIG. 5, couples to the highlighter cap 204. The blade cartridge 210 is inserted into the blade cartridge bay 218, whereby the leafs 214 provide a snap fit engagement within the blade cartridge bay 218.

The operation of the tool of an alternate embodiment of present invention will now be discussed. The user places a blade cartridge 210 which is in the non-active state within the blade cartridge bay 218. Once the blade cartridge 210 is engaged within the blade cartridge bay 218, the guide mechanism 250 fits within the U-shaped receptor 260 of the guide spring 256. In addition, the tabs 272A, 272B are forced apart from each other by engaging with the corresponding tab separators 278, thereby placing the blade cartridge 210 in the active state. To remove the blade cartridge 210, the user presses the leafs 214 toward each other, thereby allowing sufficient clearance to pull the blade cartridge 210 out of engagement with the knife compartment 206. As stated above, the pen cap 202 can also be coupled to the end 220 of the knife compartment 206. Once coupled, the user is able to rotate the pen cap 202 to expose the pen tip.

An embodiment of the present invention wherein the internal device of the multi-tool comprises an electronic device will now be discussed. This embodiment is illustrated in FIGS. 14–17.

Figure 14:
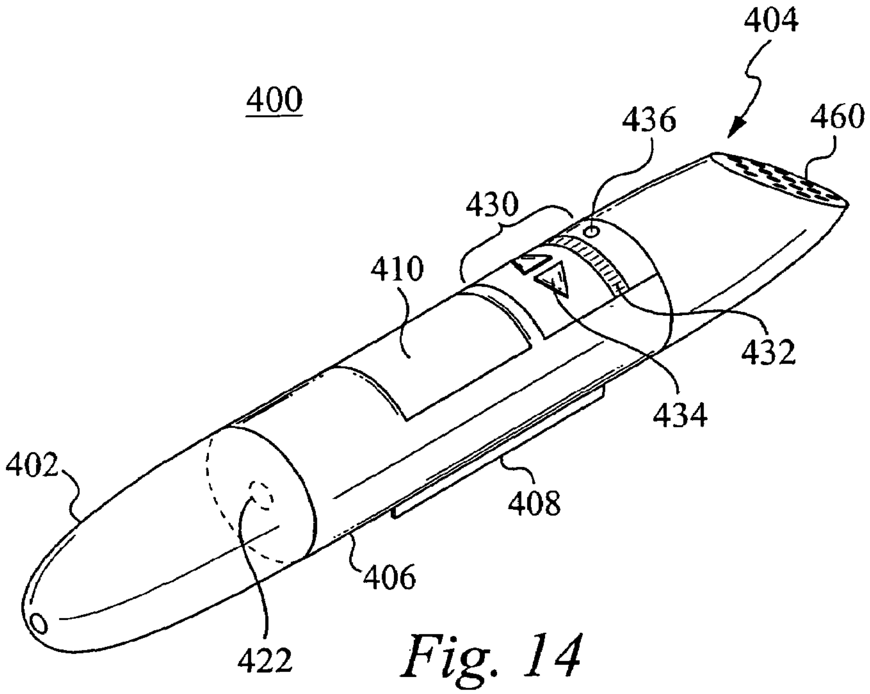
FIG. 14 illustrates a perspective view of the assembled preferred embodiment of the utility tool in accordance with the present invention.

FIGS. 14, 15A, 15B, 16A and 16B together illustrate the multitool of this embodiment of the present invention. FIG. 14 illustrates a perspective view of the utility tool comprising an electronic device in accordance with the present invention. Generally, the utility tool 400 includes a bar code reader capsule 402, an audio output capsule 404, a main electronics housing 406, a pocket clip 408 as well as a memory module cartridge 410 which fits in the memory module bay 418.

Figure 15A:
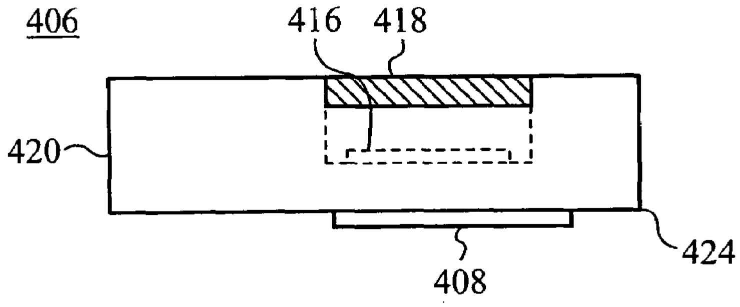
FIG. 15A illustrates a cross sectional view of the main body of the preferred embodiment of the present invention.
Figure 15B:
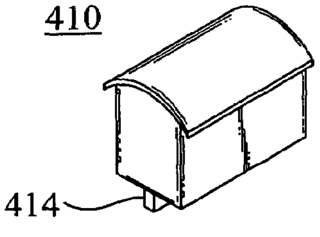
FIG. 15B illustrates a perspective view of the memory module cartridge of the preferred embodiment of the present invention.

As illustrated in FIG. 15A, the electronics housing 406 has a generally cylindrical shape and two ends 420, 424. Referring to FIGS. 14 and 15A, the ends 420, 424 both include a bus interface 422. The end 420 receives the pen capsule 202 and/or the highlighter capsule 204 and/or the bar code scanner capsule 402, as will be described below. The end 424 receives the audio output capsule 404 and/or the bar code scanner capsule 402. FIG. 15B shows the memory module cartridge 410 comprising a parallelepiped-shaped body with the bus interface 414 on one surface. The memory module bay 418 receives the memory module 410, wherein the bus interfaces 414 and 416 are coupled to transmit information. The housing further comprises a control interface 430 comprising a volume control 432, a track control 434 and a minijack 436.

Figure 16A:
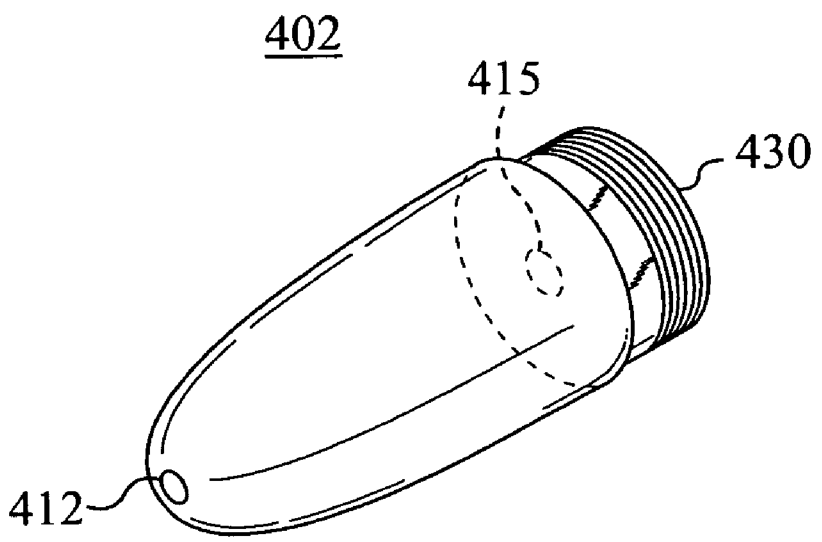
FIG. 16A illustrates a perspective view of the bar code scanner capsule of the preferred embodiment of the present invention.

FIG. 16A illustrates the bar code scanner capsule 402 comprising a tapered, substantially conical body having an opening 412 through which laser light may pass. The capsule further comprises a coupling means 430 for attachment to the ends 420 and 424 of the electronics hosing 406. Within the coupling means 430 is a bus interface 415 which couples to the bus interface 422 of the electronics housing 406.

Figure 16B:
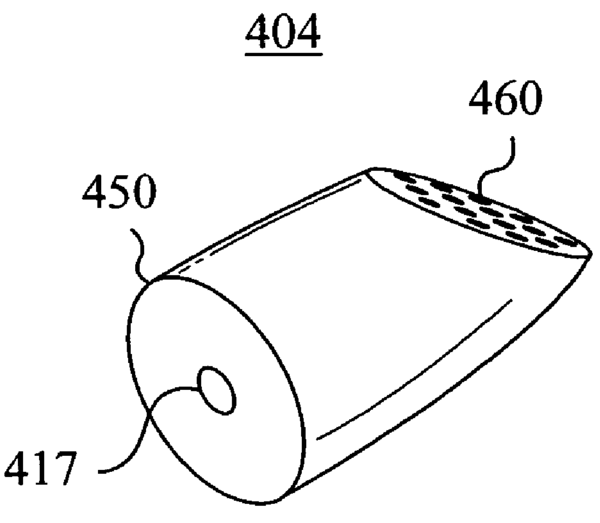
FIG. 16B illustrates a perspective view of the audio output capsule of the preferred of the present invention.

FIG. 16B illustrates the audio output capsule 404 comprising a coupling means 450 joined to a main speaker body 460. The coupling means 450 further comprises a bus interface 417 which couples to the bus interface 422 of the electronics housing 406 when the coupling means is attached to the ends 420, 424.

The method of use and assembly for this embodiment with an electronic component is substantially similar to that of the second alternate embodiment discussed above. Any of the capsules illustrated in FIGS. 7, 8, 16A and 16B are optionally couplable to the ends 220, 224 of the electronics housing 406 for the convenience of the user. The user couples the bar code scanner capsule 402 to either of the ends 420, 424 whereby the bus interface 415 couples to the bus interface 422 to transmit information. Further, the user couples the audio output capsule 404 to the end 424 whereby the bus interface 417 couples to the bus interface 422 to transmit information. The user places a memory module cartridge 410 which is in the non-active state within the blade cartridge bay 418. Once the memory module cartridge 410 is engaged within the memory module cartridge bay 418, the bus interface 414 couples with the bus interface 416. As stated above, the pen cap 202 can also be coupled to the end 420 of the electronics housing 406. Further, the blade cartridge 210 can also still be coupled with the main tool body 206. Once coupled, the user is able to rotate the pen cap 202 to expose the pen tip. In this embodiment, the pen cap 202 does not engage the bus interface 422.

Figure 17:
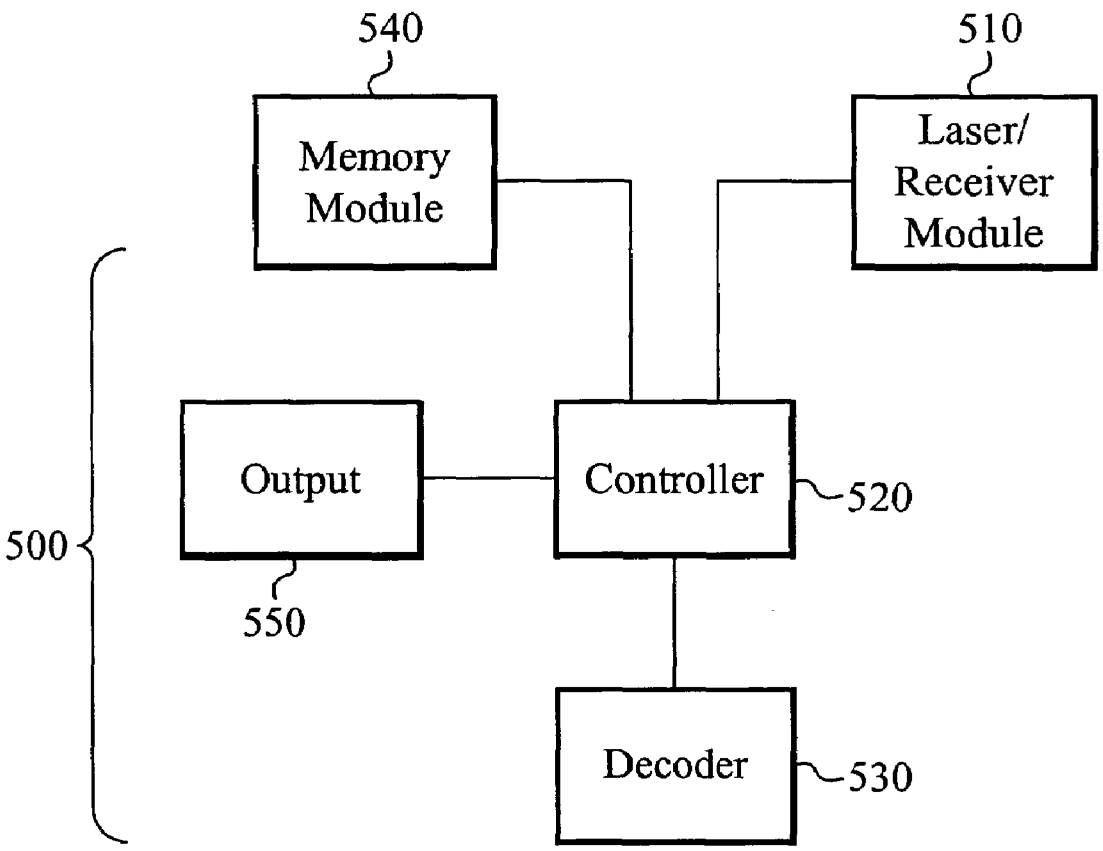
FIG. 17 illustrates a block diagram of the bar code reader of the preferred embodiment of the present invention.

FIG. 17 illustrates the control scheme 500 for the bar code scanner of the present invention. This schematic represents an electric circuit that is decomposed between the electronics housing 406 and the bar code scanner capsule 424 of the present invention, but alternately is housed completely in the bar code scanner capsule 424. Laser light is generated in the laser/receiver module 510 and subsequently passes through the opening 412 to the workpiece, some light reflects from the workpiece, and some of that light passes back through the opening 412 and contacts the laser/receiver module 510. The module 510 sends a signal to the controller 520 which interfaces with the decoder 530 and the memory module 540 to store the collected signal in a standard format. Preferably, the user is able to obtain data from the memory module by attaching it to a standard memory reader. Alternately, should the user wish to obtain the data from the memory module 540, the user will interface with the output mechanism 550 by attaching a hot-pluggable bus interface thereto. The output mechanism will subsequently interact with the controller 540, and obtain data from the memory module 540.

It should be clear that the memory module 540 corresponds to the memory module cartridge 410 of the previous figures. Further, the connection between the bus interfaces 422, 415 occurs at an arbitrary location within the circuit. However, the memory module 540 is alternately a component of the capsule 424. Furthermore, the output mechanism 550 corresponds to the bus interface 415 of the capsule 424. Whereby the connection between the bus interfaces 422, 415 corresponds to a request for output from the internal memory of the capsule 424 (540 in FIG. 17) by the memory module 410.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A utility tool comprising:

a. a body having a first end and a second end, wherein the first end and the second end are positioned on opposite ends of the body;

b. an electronic device positioned within the body, wherein an interface within the body communicates with the electronic device;

c. a first tool configured to be selectively coupled to both the first end and the second end of the body, wherein the first tool is communicatively couplable to the electronic device; and d. a removable memory module positioned within the body, wherein the removable memory module communicates with the electronic device.

2. The utility tool of claim 1 further comprising a second tool configured to be selectively coupled to both the first end and the second end of the body device.

3. The utility tool of claim 1 wherein the first tool is a barcode reader.

4. The utility tool of claim 2 wherein the second tool is a writing instrument.

5. The utility tool of claim 1 wherein the electronic device comprises an audio producing device.

6. The utility tool of claim 5 wherein the interface comprises a volume control and a mini-jack headphone adapter.

7. The utility tool of claim 5 wherein the body further comprises a speaker operatively coupled to the audio producing device.

8. The utility tool of claim 1 wherein the electronic device comprises an internal memory module.

9. The utility tool of claim 8 wherein the first tool is a bar code reader.

10. A utility tool comprising:

a. a body having a substantially cylindrical shape, wherein the body includes a first end and a second end positioned opposite from one another, the body including an electronic device and a memory module bay within;

b. a removable memory module coupled to the memory module bay, wherein the memory module couples to a communication means extending out of either end of the body; and c. a first tool configured to be selectively coupled to both the first end and the second end.

11. The utility tool of claim 10 wherein the first tool is operatively coupled to the communication means of the body when it is coupled to an end of the body.

12. The utility tool of claim 10 wherein the tool further comprises a second tool configured to be selectively coupled to both the first end and the second end.

13. The utility tool of claim 11 wherein the first tool is a bar code scanner.

14. The utility tool of claim 11 wherein the first tool is an audio producing device.

15. The utility tool of claim 12 wherein the second tool is a writing instrument.

* * * * *

UNITED STATES PATENT AND TRADEMARK OFFICE
CERTIFICATE OF CORRECTION

PATENT NO. : 7,237,340 B2
APPLICATION NO. : 10/997386
DATED : July 3, 2007
INVENTOR(S) : Ronald L. Johnson et al.

It is certified that error appears in the above-identified patent and that said Letters Patent is hereby corrected as shown below:

<u>IN THE DRAWINGS</u>
Delete Fig. 10A, and replace with Fig. 10A as shown.

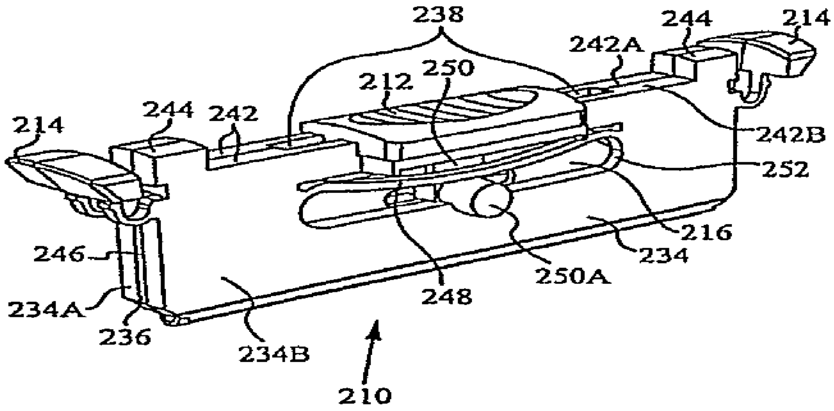

*Fig. 10A*

In column 14, line 11, replace “knife blade 212” with --knife blade 216--.
In column 16, line 31, replace “knife switch 216” with --knife switch 212--.
In column 17, line 19, replace “232B” with --234B--.
In column 17, line 47, replace “212” with --216--.
In column 17, line 48, replace “212” with --216--.
In column 19, line 11, “blade cartridge bay 418” with --memory module cartridge bay 418--.
In column 19, line 23, replace “424” with --402--.
In column 19, line 25, replace “424” with --402--.

Signed and Sealed this

Twenty-eighth Day of August, 2007

JON W. DUDAS
*Director of the United States Patent and Trademark Office*